US012550506B2

United States Patent
Cheng et al.

(10) Patent No.: US 12,550,506 B2
(45) Date of Patent: Feb. 10, 2026

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yudiao Cheng, Beijing (CN); Yanwei Lu, Beijing (CN); Weiyun Huang, Beijing (CN); Lili Du, Beijing (CN); Yuanjie Xu, Beijing (CN); Zhuoran Yan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 407 days.

(21) Appl. No.: 18/024,972

(22) PCT Filed: Mar. 24, 2022

(86) PCT No.: PCT/CN2022/082858
§ 371 (c)(1),
(2) Date: Mar. 7, 2023

(87) PCT Pub. No.: WO2023/178619
PCT Pub. Date: Sep. 28, 2023

(65) Prior Publication Data
US 2024/0282897 A1    Aug. 22, 2024

(51) Int. Cl.
*H01L 33/62* (2010.01)
*H01L 25/075* (2006.01)
(Continued)

(52) U.S. Cl.
CPC ....... *H10H 20/857* (2025.01); *H01L 25/0753* (2013.01); *H01L 25/167* (2013.01);
(Continued)

(58) Field of Classification Search
None
See application file for complete search history.

(56) References Cited

U.S. PATENT DOCUMENTS

| 2020/0343417 A1 | 10/2020 | Miyamoto |
| 2021/0012706 A1 | 1/2021 | Yang et al. |

(Continued)

FOREIGN PATENT DOCUMENTS

| CN | 109599053 A | 4/2019 |
| CN | 109686311 A | 4/2019 |

(Continued)

*Primary Examiner* — William C Trapanese
(74) *Attorney, Agent, or Firm* — XSENSUS LLP

(57) ABSTRACT

Provided is a display panel, including: a substrate, a connection line, a first pixel drive circuit, a first insulative layer, and first light-emitting devices. The substrate includes a light-transmissive display region and a conventional display region at least partially surrounding the light-transmissive display region. The connection line and the first pixel drive circuit are disposed on the substrate. The connection line is electrically connected to the first pixel drive circuit. The first pixel drive circuit is disposed in the conventional display region. The first insulative layer is disposed on a side, distal from the substrate, of the connection line and is provided with first via holes arranged in arrays. The first light-emitting devices are disposed on a side, distal from the substrate, of the first insulative layer and arranged in arrays in the light-transmissive display region and electrically connected to the connection lines via the first via holes.

18 Claims, 13 Drawing Sheets

(51) Int. Cl.
*H01L 25/16* (2023.01)
*H10D 86/40* (2025.01)
*H10D 86/60* (2025.01)
*H10H 20/857* (2025.01)
*H10H 29/14* (2025.01)

(52) U.S. Cl.
CPC ........... *H10D 86/443* (2025.01); *H10D 86/60* (2025.01); *H10H 29/142* (2025.01)

(56) References Cited

U.S. PATENT DOCUMENTS

| | | |
|---|---|---|
| 2021/0335221 A1 | 10/2021 | Ma et al. |
| 2022/0045155 A1 | 2/2022 | Ma et al. |

FOREIGN PATENT DOCUMENTS

| | | | | |
|---|---|---|---|---|
| CN | 110767675 A | | 2/2020 | |
| CN | 110911438 A | | 3/2020 | |
| CN | 110911439 A | | 3/2020 | |
| CN | 111261684 A | | 6/2020 | |
| CN | 111785761 A | | 10/2020 | |
| CN | 111785853 A | | 10/2020 | |
| CN | 112511761 A | | 3/2021 | |
| CN | 113096581 A | | 7/2021 | |
| CN | 113140196 A | | 7/2021 | |
| CN | 113555400 A | | 10/2021 | |
| CN | 114122013 A | * | 3/2022 | ............. H10D 86/60 |

* cited by examiner

DISPLAY PANEL AND DISPLAY DEVICE

CROSS-REFERENCE TO RELATED APPLICATION

This present disclosure is a U.S. national stage of international application No. PCT/CN2022/082858, field on Mar. 24, 2022, the content of which is herein incorporated by reference in its entirety.

TECHNICAL FIELD

The present disclosure relates to the technical field of displays, and in particular, relates to a display panel and a display device.

BACKGROUND OF THE INVENTION

At present, display devices are generally provided with photo-sensitive sensors such as image sensors to implement a photographing function or a biometric function.

SUMMARY OF THE INVENTION

Embodiments of the present disclosure provide a display panel and a display device.

According to one aspect of the embodiments of the present disclosure, a display panel is provided. The display panel includes:
- a substrate, including a light-transmissive display region and a conventional display region at least partially surrounding the light-transmissive display region;
- a connection line and a first pixel drive circuit, wherein the connection line and the first pixel drive circuit are disposed on the substrate, the connection line is electrically connected to the first pixel drive circuit, and the first pixel drive circuit is disposed in the conventional display region;
- a first insulative layer, wherein the first insulative layer is disposed on a side, distal from the substrate, of the connection line and is provided with first via holes arranged in arrays; and
- first light-emitting devices, disposed on a side, distal from the substrate, of the first insulative layer, wherein the first light-emitting devices are arranged in arrays in the light-transmissive display region and electrically connected to the connection lines via the first via holes;
- wherein the light-transmissive display region includes a first light-transmissive display region, and the conventional display region includes a first conventional display region adjacent to the first light-transmissive display region in a column direction, wherein in the first light-transmissive display region, the first light-emitting devices disposed in different columns are respectively electrically connected to first connection lines of the connection lines via the first via holes disposed in a same column, the first connection line being electrically connected to the first pixel drive circuit in the first conventional display region.

In some embodiments, the light-transmissive display region further includes a second light-transmissive display region, and the conventional display region further includes a second conventional display region adjacent to the second light-transmissive display region in a row direction, wherein the first light-emitting devices disposed in different rows are electrically connected to second connection lines of the connection lines via the first via holes disposed in a same row, the second connection line being electrically connected to the first pixel drive circuit in the second conventional display region.

In some embodiments, in the first light-transmissive display region, the first light-emitting devices include at least two groups of the first light-emitting devices arranged along the column direction, wherein the connection lines electrically connected to the at least two groups of the first light-emitting devices are disposed in different layers.

In some embodiments, in the second light-transmissive display region, the first light-emitting devices include at least two groups of the first light-emitting devices arranged along the row direction, wherein the connection lines electrically connected to the at least two groups of the first light-emitting devices are disposed in different layers.

In some embodiments, in a plurality of the connection lines electrically connected to the at least one group of the first light-emitting devices, at least one of the connection lines includes a first sub-connection line and a second sub-connection line, wherein one end of the first sub-connection line is electrically connected to the second sub-connection line, and the other end is electrically connected to the first light-emitting device, an included angle between an extension direction of the second sub-connection line and the column direction being an acute angle.

In some embodiments, the first light-transmissive display region includes a first light-transmissive zone and a second light-transmissive zone that are arranged along the column direction; and
the second light-transmissive display region includes a third light-transmissive zone and a fourth light-transmissive zone that are arranged along the row direction.

In some embodiments, the first light-transmissive zone, the second light-transmissive zone, the third light-transmissive zone, and the fourth light-transmissive zone are in a same shape.

In some embodiments, arrangement positions of a plurality of the first via holes disposed in the first light-transmissive zone and arrangement positions of a plurality of the first via holes disposed in the second light-transmissive zone are symmetrical about a first axis of symmetry of the light-transmissive display region, wherein the first axis of symmetry is parallel to the row direction; and
arrangement positions of a plurality of the first via holes disposed in the third light-transmissive zone and arrangement positions of a plurality of the first via holes disposed in the fourth light-transmissive zone are symmetrical about a second axis of symmetry of the light-transmissive display region, wherein the second axis of symmetry is parallel to the column direction.

In some embodiments, at least one target light-transmissive zone of the first light-transmissive zone, the second light-transmissive zone, the third light-transmissive zone, and the fourth light-transmissive zone includes a first sub-zone and a second sub-zone that are symmetrically arranged, and a center of the light-transmissive display region is disposed on an axis of symmetry of the target light-transmissive zone; wherein
in the target light-transmissive zone, an arrangement position of the first via hole in the first sub-zone and an arrangement position of the first via hole in the second sub-zone are symmetrical about the axis of symmetry of the target light-transmissive zone.

In some embodiments, in the target light-transmissive zone, the connection line electrically connected to the first light-emitting device in the first sub-zone and the connection line electrically connected to the first light-emitting device in the second sub-zone are symmetrical about the axis of symmetry of the target light-transmissive zone in terms of shape.

In some embodiments, the display panel further includes a second insulative layer, wherein the second insulative layer is disposed on a side, proximal to the substrate, of the connection line and is provided with second via holes arranged in arrays; wherein the first pixel drive circuits are arranged in arrays in the conventional display region, and in the first conventional display region, the first pixel drive circuits disposed in different columns are respectively electrically connected to the first connection lines of the connection lines via the second via holes disposed in a same column.

In some embodiments, the display panela further includes: a second insulative layer, wherein the second insulative layer is disposed on a side, proximal to the substrate, of the connection line and is provided with second via holes arranged in arrays; wherein the first pixel drive circuits are arranged in arrays in the conventional display region, and in the second conventional display region, the first pixel drive circuits disposed in different rows are respectively electrically connected to the second connection lines of the connection lines via the second via holes disposed in a same row.

In some embodiments, the display panel further includes: a plurality of second pixel drive circuits and a plurality of second light-emitting devices that are disposed in the conventional display region, and the plurality of second pixel drive circuits and the plurality of second light-emitting devices that are disposed in the conventional display region are respectively electrically connected to each other;

wherein an arrangement density of the plurality of second light-emitting devices disposed in the conventional display region and an arrangement density of the plurality of first light-emitting devices disposed in the light-transmissive display region are identical.

In some embodiments, the display panel further includes a transparent conductive connection line disposed on the first insulative layer, wherein one end of the transparent conductive connection line is electrically connected to the first light-emitting device, and the other end is electrically connected to the connection line via the first via hole.

According to another aspect of the embodiments of the present disclosure, a display device is provided. The display device includes: a photo-sensitive sensor and a display panel as described above, wherein the photo-sensitive sensor is disposed on a side, distal from a light-emitting device of the display panel, of a substrate of the display panel, and an orthographic projection of an in-light surface of the photo-sensitive sensor on the substrate of the display panel is within a light-transmissive display region.

The display device includes: a photo-sensitive sensor and a display panel as described above, wherein the photo-sensitive sensor is disposed on a side, distal from a light-emitting device of the display panel, of a substrate of the display panel, and an orthographic projection of an in-light surface of the photo-sensitive sensor on the substrate of the display panel is within a light-transmissive display region.

BRIEF DESCRIPTION OF DRAWINGS

For clearer descriptions of the technical solutions in the embodiments of the present disclosure, the following briefly introduces the accompanying drawings to be required in the descriptions of the embodiments. Apparently, the accompanying drawings in the following description show merely some embodiments of the present disclosure, and persons of ordinary skills in the art may still derive other drawings from these accompanying drawings without creative efforts.

For some specific embodiments of the present disclosure illustrated by the above drawings, detailed descriptions are given hereinafter. Drawings and descriptions are not intended to limit the scope of the conception of the present disclosure, but only to illustrate the concept of the present disclosure for those skilled in the art by referring to the specific embodiments.

DETAILED DESCRIPTION

To increase a screen-to-body ratio of the display device, a light-transmissive display region that is capable of transmitting light and also displaying images is deployed on the display panel, and the image sensor is deployed on a back side of the light-transmissive display region of the display panel.

Typically, the display panel includes a substrate, and a plurality of pixel drive circuits, an insulative layer, and a plurality of light-emitting devices that are disposed on the substrate. The substrate includes a light-transmissive display region and a conventional display region disposed on two sides of the light-transmissive display region. The light-emitting devices are disposed in the two regions, and the pixel drive circuits are disposed in the conventional display region.

However, a display effect of the light-transmissive display region of the above display panel is poor.

The present disclosure is described hereinafter in further detail with reference to the accompanying drawings to clearly present the objects, technical solutions, and advantages of the present disclosure.

At present, a screen-to-body ratio of a display device is increased by deploying a display panel in the display device to be a partially light-transmissive display panel. Exemplarily, the display panel includes: a light-transmissive display region and a conventional display region disposed on a periphery of the light-transmissive display region. The light-transmissive display region is also referred to as a full display with camera (FDC) region. Light-emitting devices are arranged in both the conventional display region and the light-transmissive display region, such that the conventional display region and the light-transmissive display region are both capable of displaying pictures.

In the display panel, more pixel drive circuits are arranged in the conventional display region by compressing, in a row direction and a column direction, the pixel drive circuits arranged in arrays in the conventional display region. Excessive pixel drive circuits are electrically connected to the light-emitting devices in the light-transmissive display region to drive the light-emitting devices in the light-transmissive display region.

Figure 1:
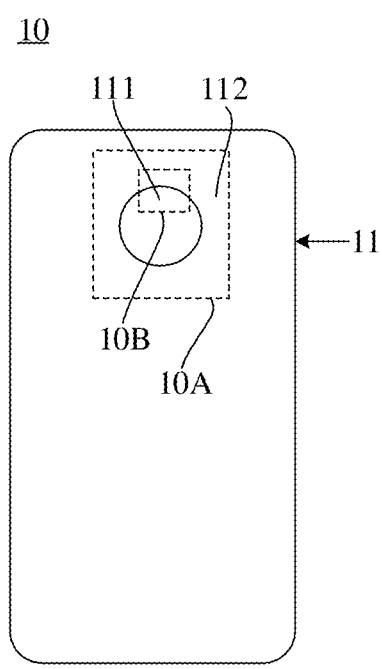
FIG. 1 is a schematic structural diagram of a display panel.
Figure 2:
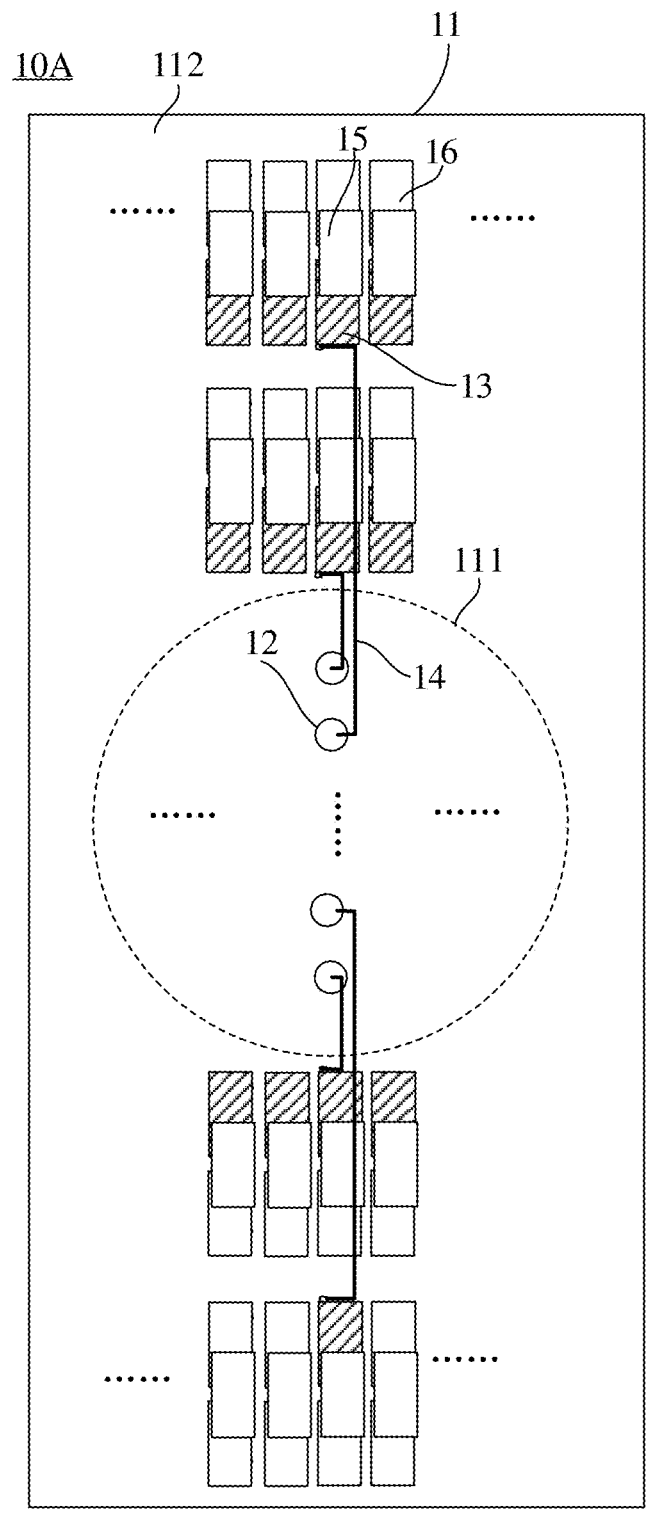
FIG. 2 is a schematic structural diagram of a portion 10A in the display panel illustrated in FIG. 1.
Figure 3:
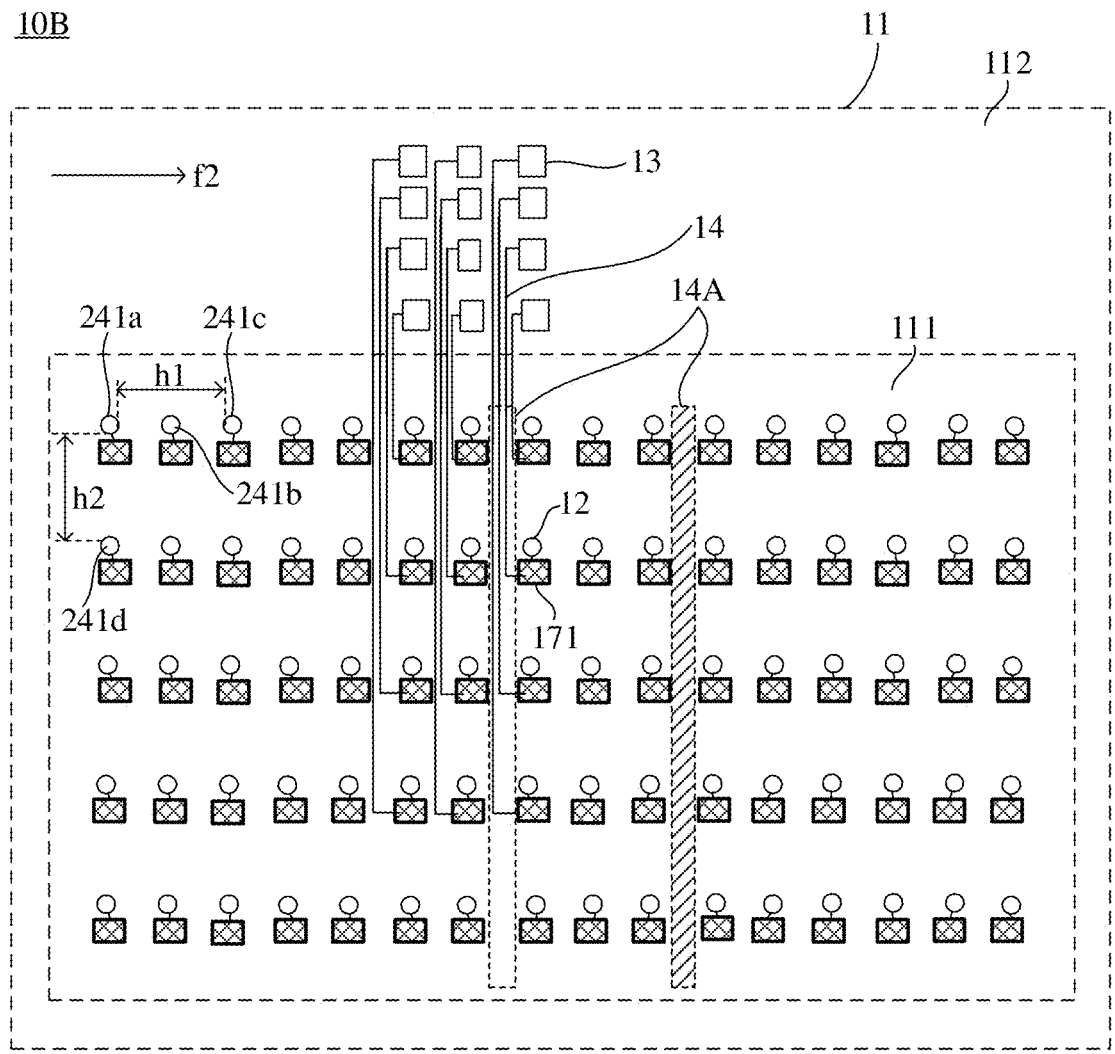
FIG. 3 is a schematic diagram of connection of a light-emitting device and a pixel drive circuit that are in a portion 10B of a light-transmissive display region of the display panel illustrated in FIG. 1.

FIG. 1 is a schematic structural diagram of a display panel, FIG. 2 is a schematic structural diagram of a portion 10A in the display panel illustrated in FIG. 1, and FIG. 3 is a schematic diagram of connection of a light-emitting device and a pixel drive circuit that are in a portion 10B of a light-transmissive display region of the display panel illustrated in FIG. 1. Referring to FIG. 1, FIG. 2, and FIG. 3, the display panel includes: a substrate 11. The substrate 11 includes a light-transmissive display region 111 and a conventional display region 112 that is non-transmissive.

A plurality of light-emitting devices 12 are arranged in the light-transmissive display region 111, and a plurality of pixel drive circuits 13 electrically connected to the plurality of light-emitting devices in the light-transmissive display region 111 are arranged in the conventional display region 112. The plurality of pixel drive circuits 13 are disposed on two sides of the light-transmissive display region 111, such that a length of a connection line 14 between the light-emitting device 12 in the light-transmissive display region 111 and the electrically connected pixel drive circuit 13 is short.

The light-emitting device 12 disposed in the light-transmissive display region 111 and the pixel drive circuit 13 disposed in the conventional display region 112, which are disposed in a same column and correspondingly electrically connected to each other, form a first pixel unit. The conventional display region 112 includes the plurality of pixel drive circuits 12 and a plurality of second pixel units. The second pixel unit in the conventional display region 112 includes the light-emitting device 15 of the conventional display region and the pixel drive circuit 16 of the conventional display region.

Figure 4:
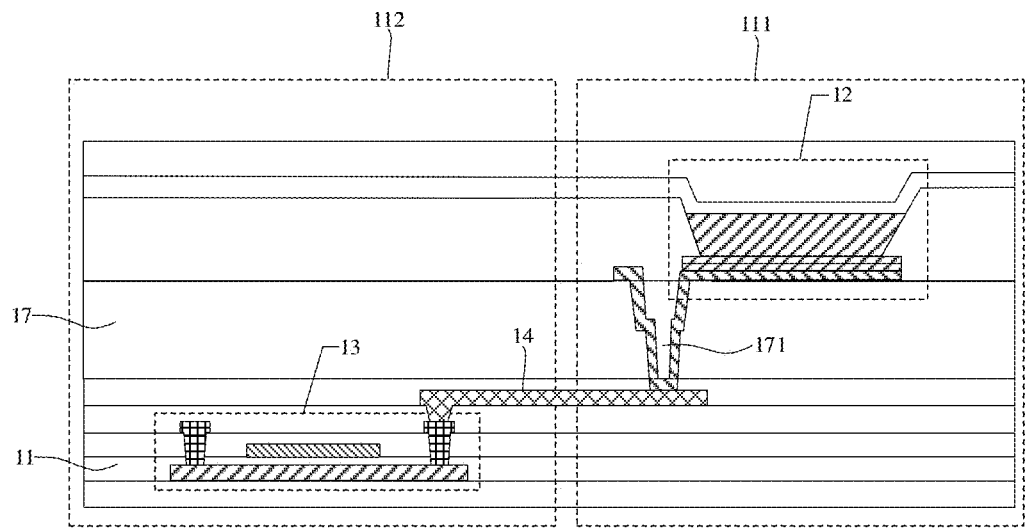
FIG. 4 is a schematic diagram of a sectional structure of line connections in a light-transmissive display region and a conventional display region of the display panel illustrated in FIG. 3.

FIG. 4 is a schematic diagram of a sectional structure of line connections in a light-transmissive display region and a conventional display region of the display panel illustrated in FIG. 3. As illustrated in FIG. 4, the display panel 10 further includes an insulative layer 17. The insulative layer 17 is disposed on a side, proximal to the substrate 11, of the light-emitting device 12, and a side, distal from the substrate 11, of the pixel drive circuit 13. The insulative layer 17 is provided with a plurality of via holes 171. The light-emitting device 12 is electrically connected to the connection line 14 via the via hole 171 and is electrically connected to the pixel drive circuit 13 in the conventional display region 112 by the connection line 14.

The connection line is disposed in a spacing 14A between two of the via holes 171 adjacent in the row direction or is disposed in a spacing between two of the via holes 171 adjacent in the column direction. Referring to FIG. 3, in the light-transmissive display region of the display panel, a distance between two of the via holes 171 adjacent in the row direction is small, and the number of connection lines between two of the via holes 171 is small, such that the number of light-emitting devices disposed in the light-transmissive display region corresponding to the connection lines is small, and thus a display effect of the light-transmissive display region is poor.

Some embodiments of the present disclosure provide a display panel and a display device, which are capable of solving the problem in some practices.

Figure 5:
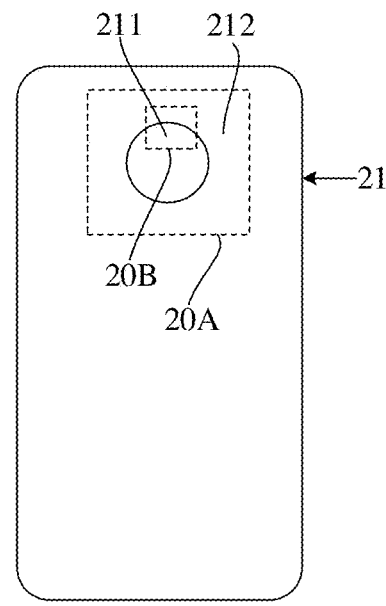
FIG. 5 is a top view of a display panel according to some embodiments of the present disclosure.
Figure 6:
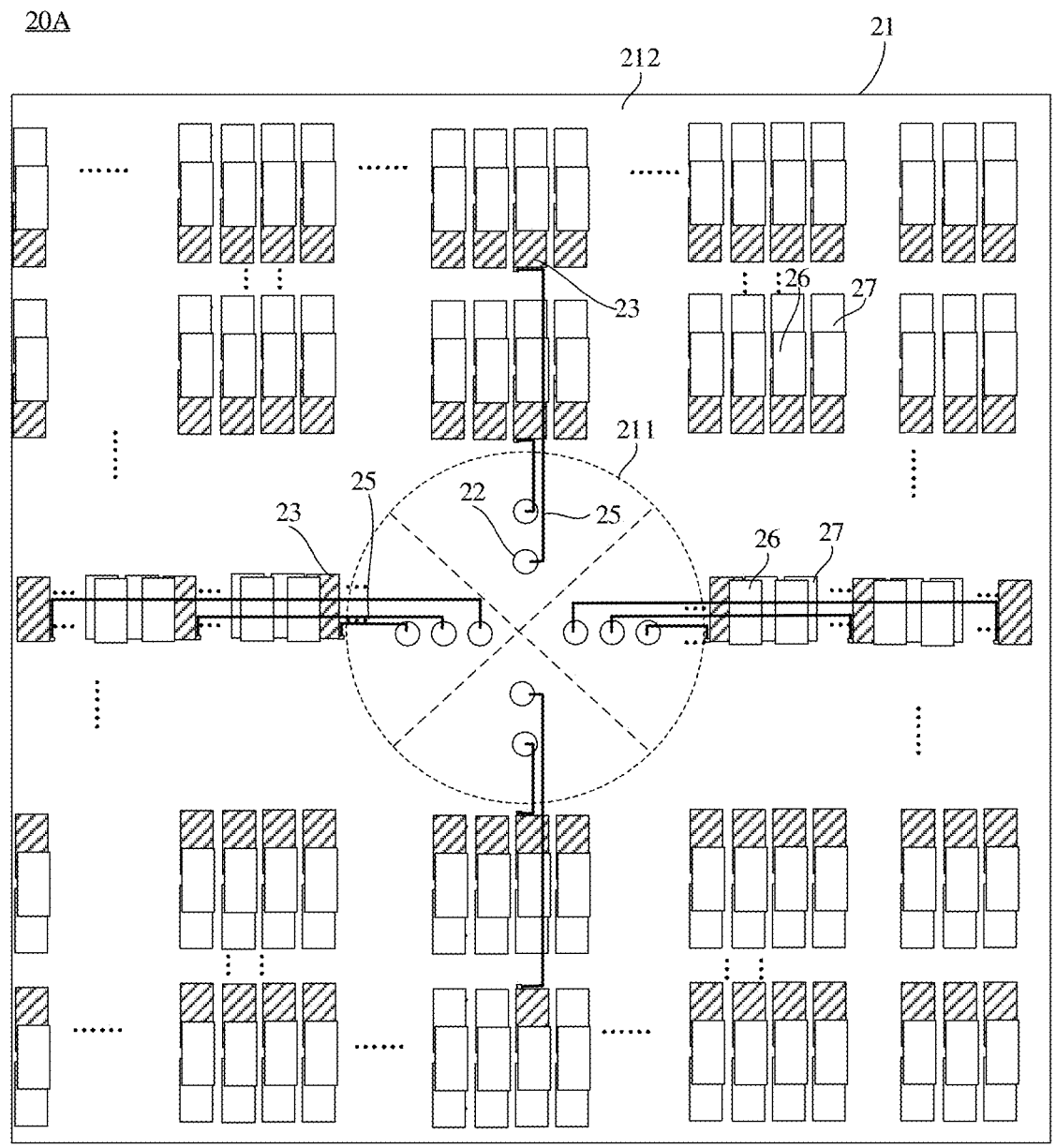
FIG. 6 is a schematic diagram of connection of a light-emitting device and a pixel drive circuit that are in a portion 20A of a light-transmissive display region of the display panel illustrated in FIG. 5.
Figure 7:
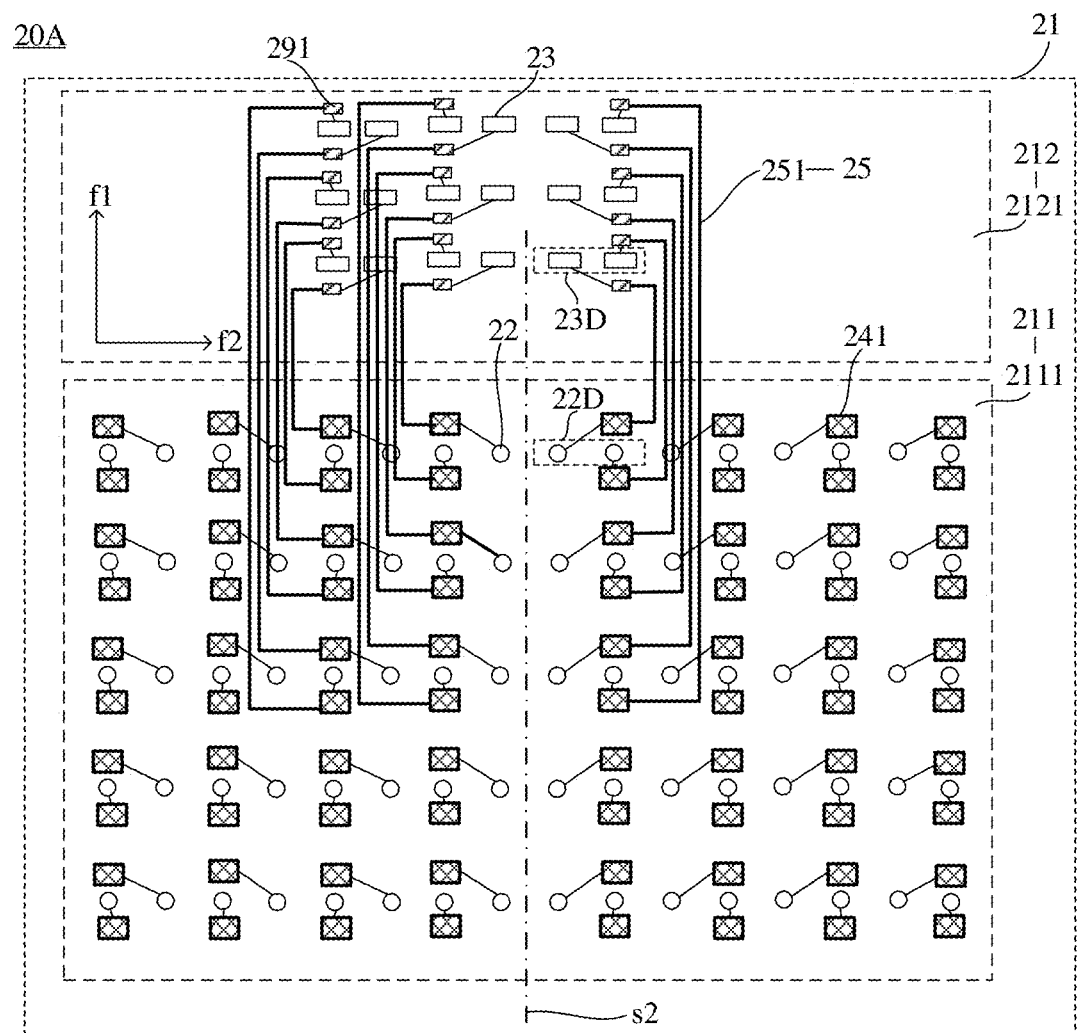
FIG. 7 is a schematic diagram of connection of a light-emitting device and a pixel drive circuit that are in a portion 20B of a light-transmissive display region of the display panel illustrated in FIG. 5.
Figure 8:
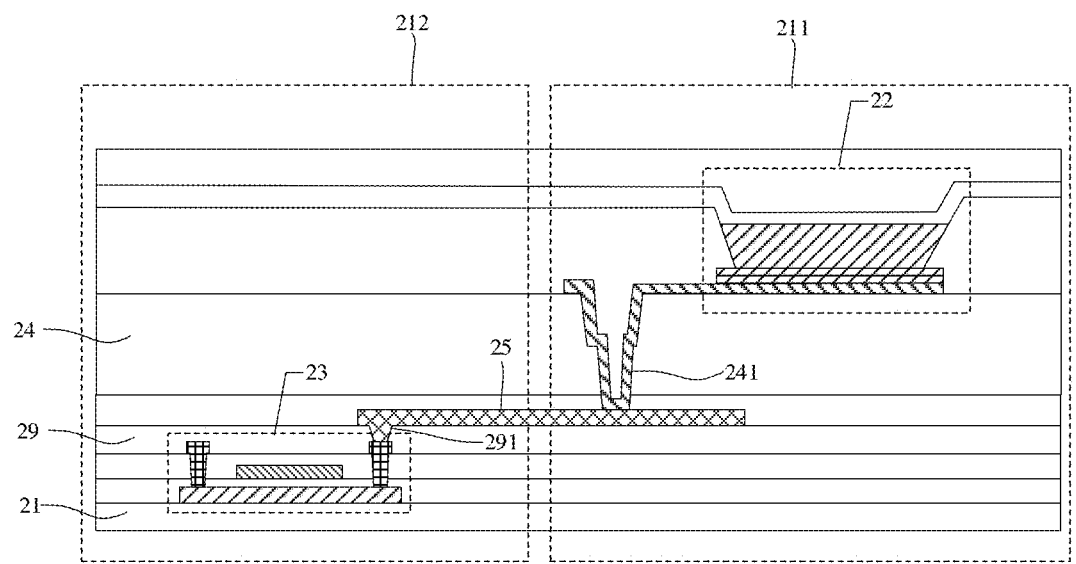
FIG. 8 is a schematic diagram of a sectional structure of line connections in a light-transmissive display region and a conventional display region of the display panel illustrated in FIG. 3.

FIG. 5 is a top view of a display panel according to some embodiments of the present disclosure. FIG. 6 is a schematic diagram of connection of a light-emitting device and a pixel drive circuit that are in a portion 20A of a light-transmissive display region of the display panel illustrated in FIG. 5. FIG. 7 is a schematic diagram of connection of a light-emitting device and a pixel drive circuit that are in a portion 20B of a light-transmissive display region of the display panel illustrated in FIG. 5. FIG. 8 is a schematic diagram of a sectional structure of line connections in a light-transmissive display region and a conventional display region of the display panel illustrated in FIG. 5. Referring to FIG. 5, FIG. 6, FIG. 7, and FIG. 8, the display 20 includes: a substrate 21, and a first light-emitting device 22, a first pixel drive circuit 23, a first insulative layer 24, and a connection line 25 that are disposed on the substrate 21. The connection line 25 and the first pixel drive circuit 23 are disposed on the substrate 21, the first insulative layer 24 is disposed on a side, distal from the substrate 21, of the connection line 25, and the first light-emitting device 22 is disposed on a side, distal from the substrate 21, of the first insulative layer 24.

The substrate 21 includes a light-transmissive display region 211 and a conventional display region 212 at least partially surrounding the light-transmissive display region 211. Exemplarily, the conventional display region 212 surrounds the light-transmissive display region 211. That is, the light-transmissive display region is surrounded by the conventional display region 212. The light-transmissive display region 211 is disposed at other positions according to actual needs. For example, the light-transmissive display region 211 is disposed on a top center of the substrate 21, or a top left corner or a top right corner of the substrate 21. Hardware such as a photo-sensitive sensor (e.g., a camera) is disposed in the light-transmissive display region 211 of the display panel 20. The light-transmissive display region 211 is circular-shaped as illustrated in FIG. 5, square-shaped, hexagonal-shaped, trapezoidal-shaped, or in other shapes, which is not limited herein.

The first pixel drive circuit 23 is disposed in the conventional display region 212, and the connection line 25 is electrically connected to the first pixel drive circuit 23. Because the conventional display region 212 surrounds the light-transmissive display region, the plurality of first pixel drive circuits 23 are disposed on a periphery of the light-transmissive display region 211.

As illustrated in FIG. 8, the first insulative layer 24 is disposed on a side, proximal to the substrate 21, of the first light-emitting device 22 and is provided with first via holes 241 arranged in arrays. The first via hole 241 penetrates the first insulative layer 24, such that the first light-emitting device 22 is electrically connected to the connection line 25 disposed on a side, proximal to the substrate 21, of the first insulative layer 24 via the first via hole 241. It should be noted that, the first insulative layer 24 includes a plurality of layers of sub-insulative layers, and different sub-insulative layers in the plurality of layers of sub-insulative layers have different insulative effects. For example, the plurality of layers of sub-insulative layers are employed to cause signal lines, such as gate lines and data lines, on the display panel 20 to be insulated from each other.

The display panel 20 is provided with a plurality of first light-emitting devices 22, and the first light-emitting devices 22 are disposed in the light-transmissive display region 211 and are arranged in arrays. The plurality of connection lines 25 electrically connected to the plurality of first light-emitting devices 22 disposed in the light-transmissive display region 211 pass through a boundary of the light-transmissive display region 211 and extend into the conventional display region 212 disposed on the periphery of the light-transmissive display region 211. The first light-emitting device 22 is electrically connected to the connection line 25 via the first via hole 231 and electrically connected to the first pixel drive circuit 23 by the connection line 25. That is, a portion of the connection line 25 is within the light-transmissive display region 211, and another portion is within the conventional display region 212. One end of each of the connection lines 25 is electrically connected to one of the first light-emitting devices 22 within the light-transmissive display region via the first via hole 241, and the other end is electrically connected to one of the first pixel drive circuits 23 within the conventional display region 212. Therefore, each of the first light-emitting devices 22 is electrically connected to one of the first pixel drive circuits 23 by one of the connection lines. In this way, the transmittance of the light-transmissive display region 211 is improved. That is, the first pixel drive circuit 23 driving the first light-emitting device 22 of the light-transmissive display region 211 is disposed in the conventional display region 212, such that the transmittance of the light-transmissive display region 211 is improved by separately disposing the first light-emitting device 22 and the first pixel drive circuit 23.

Figure 9:
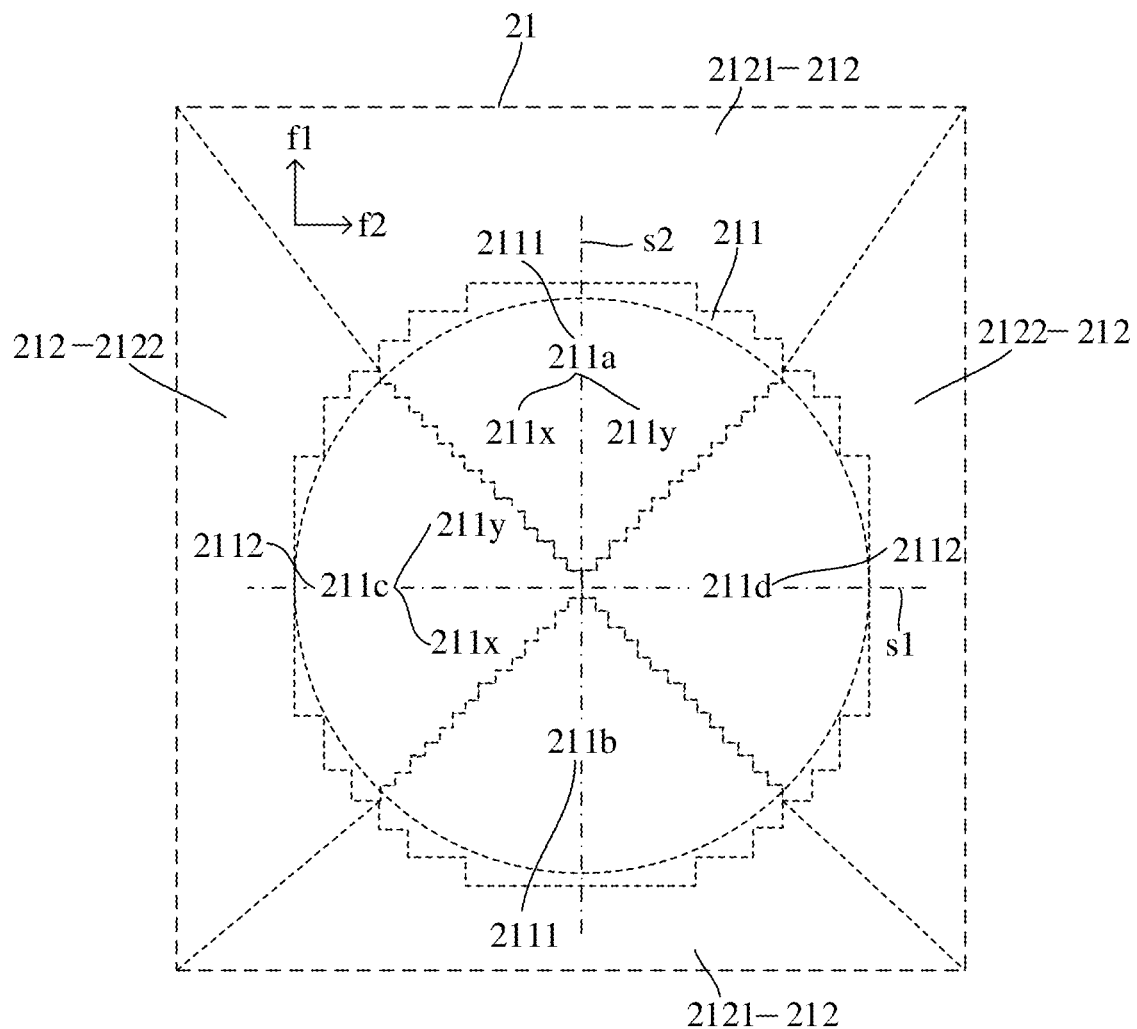
FIG. 9 is a schematic diagram of partitioning according to some embodiments of the present disclosure.
Figure 10:
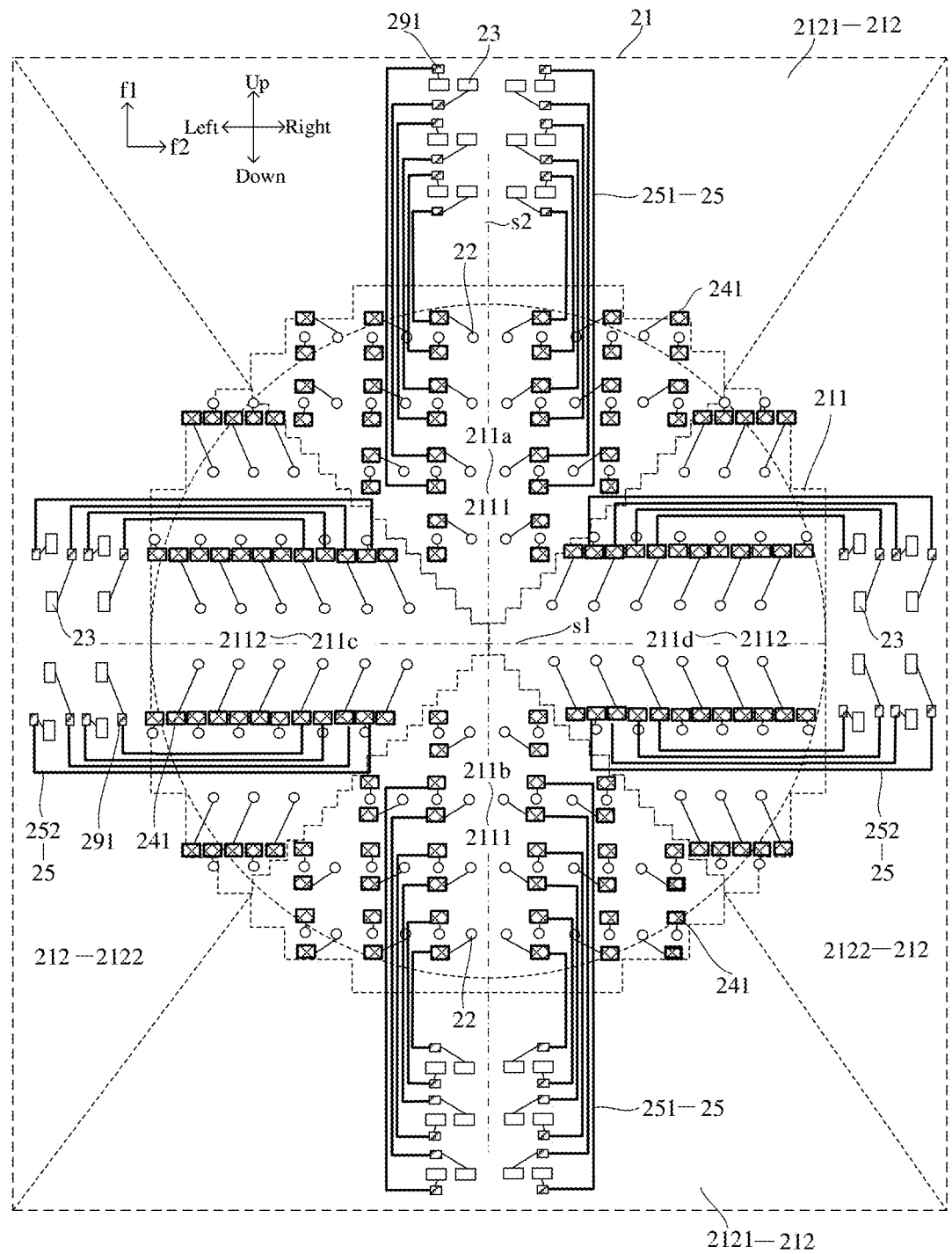
FIG. 10 is a schematic structural diagram of connection of a first light-emitting device and a first pixel drive circuit of the display panel illustrated in FIG. 9.

FIG. 9 is a schematic diagram of partitioning according to some embodiments of the present disclosure, and FIG. 10 is a schematic structural diagram of connection of a first light-emitting device and a first pixel drive circuit of the display panel illustrated in FIG. 9. Referring to FIG. 9 and FIG. 10, the light-transmissive display region 211 includes a first light-transmissive display region 2111, and the conventional display region 212 includes a first conventional display region 2121 adjacent to the first light-transmissive display region 2111 in a column direction f1. It should be noted that, as illustrated in FIG. 9, a junction of the light-transmissive display region 211 and the conventional display region 212 is provided with a plurality of light-emitting devices, and the plurality of light-emitting devices belong to the light-transmissive display region 211, such that step-shaped regions are added to the periphery of the light-transmissive display region 211 on the basis of the circle. Alternatively, the plurality of light-emitting devices belong to the conventional display region 212.

In the first light-transmissive display region 2111 and the first conventional display region 2121, the first pixel drive circuit 23 is disposed in the column direction f1 of the first light-emitting devices 22. As illustrated in FIG. 10, the plurality of first pixel drive circuits 23 are disposed on an upper side and an underside of the first light-transmissive display region 2111 illustrated in FIG. 10.

In the first light-transmissive display region 2111, the first light-emitting devices 22 disposed in different columns are respectively electrically connected to first connection lines 251 of the connection lines 25 via the first via holes 241 disposed in a same column, and the first connection lines 251 are electrically connected to the first pixel drive circuits 23 in the first conventional display region 2121. In this way, a distance between two of the first via holes 241 adjacent in a row direction f2 is large.

Relative to some practices where the first light-emitting devices 12 disposed in a same column are respectively electrically connected to the connection lines 14 via the via holes 171 disposed in a same column as illustrated in FIG. 3, in the embodiments of the present disclosure, by disposing the first via holes 241 corresponding to two or more columns of light-emitting devices 22 in one column, a space employed for disposing the first via holes 241 in some practices is employed for disposing the connection lines 25. In this way, the distance between two of the first via holes 241 adjacent in the row direction f2 is increased, such that the number of first connection lines 251 between adjacent two of the first via holes 241 is increased, and thus the number of first light-emitting devices 22 in the light-transmissive display region 211 is increased. Therefore, the problem that the number of light-emitting devices corresponding to the connection lines 25 in the light-transmissive display region 211 is small due to the small number of connection lines 25 connected to the light-emitting devices disposed in the light-transmissive display region 211 in the display panel 20 in some practices is addressed, such that a display effect of the light-transmissive display region 211 is improved.

Exemplarily, a portion of each of the connection lines 25 disposed in the light-transmissive display region 211 is made of light-transmissive conductive materials, such that the transmittance of the light-transmissive display region 211 is improved. To simplify a manufacturing process of the connection line 25, the connection line 25 is completely made of the light-transmissive conductive materials. The light-transmissive conductive material is an indium tin oxide (ITO).

In summary, some embodiments of the present disclosure provide a display panel. The first light-emitting device is electrically connected to the first pixel drive circuit via the first via hole and the connection line, and the first light-emitting devices disposed in different columns are electrically connected to the first connection lines via the first via holes disposed in the same column. In this way, the distance between two of the first via holes adjacent in the row direction is increased, such that more first connection lines are capable of being arranged between the two first via holes, and thus the number of first light-emitting devices in the light-transmissive display region is increased. Therefore, the problem of the poor display effect of the light-transmissive display region of the display panel in some practices is addressed, and the display effect of the light-transmissive display region is improved.

Optionally, as illustrated in FIG. 9 and FIG. 10, the light-transmissive display region 211 further includes a second light-transmissive display region 2112, and the conventional display region 212 further includes a second conventional display region 2122 adjacent to the second light-transmissive display region 2112 in the row direction 2. In the second light-transmissive display region 2112 and the second conventional display region 2122, the first pixel drive circuit is disposed in the row direction f2 of the first light-emitting device 22. As illustrated in FIG. 10, the plurality of first pixel drive circuits 23 are disposed on a left side and a right side of the second light-transmissive display region 2112. In the second light-transmissive display region 2112, the first light-emitting devices 22 disposed in different rows are respectively electrically connected to second connection lines 252 of the connection lines 25 via the first via holes 241 disposed in a same row, and the second connection lines 252 are electrically connected to the first pixel drive circuits 23 in the second conventional display region 2122. In this way, a distance between two of the first via holes 241 adjacent in the column direction f1 is large, such that the number of connection lines 25 between two of the first via holes 241 adjacent in the column direction f1 is increased.

Figure 11:
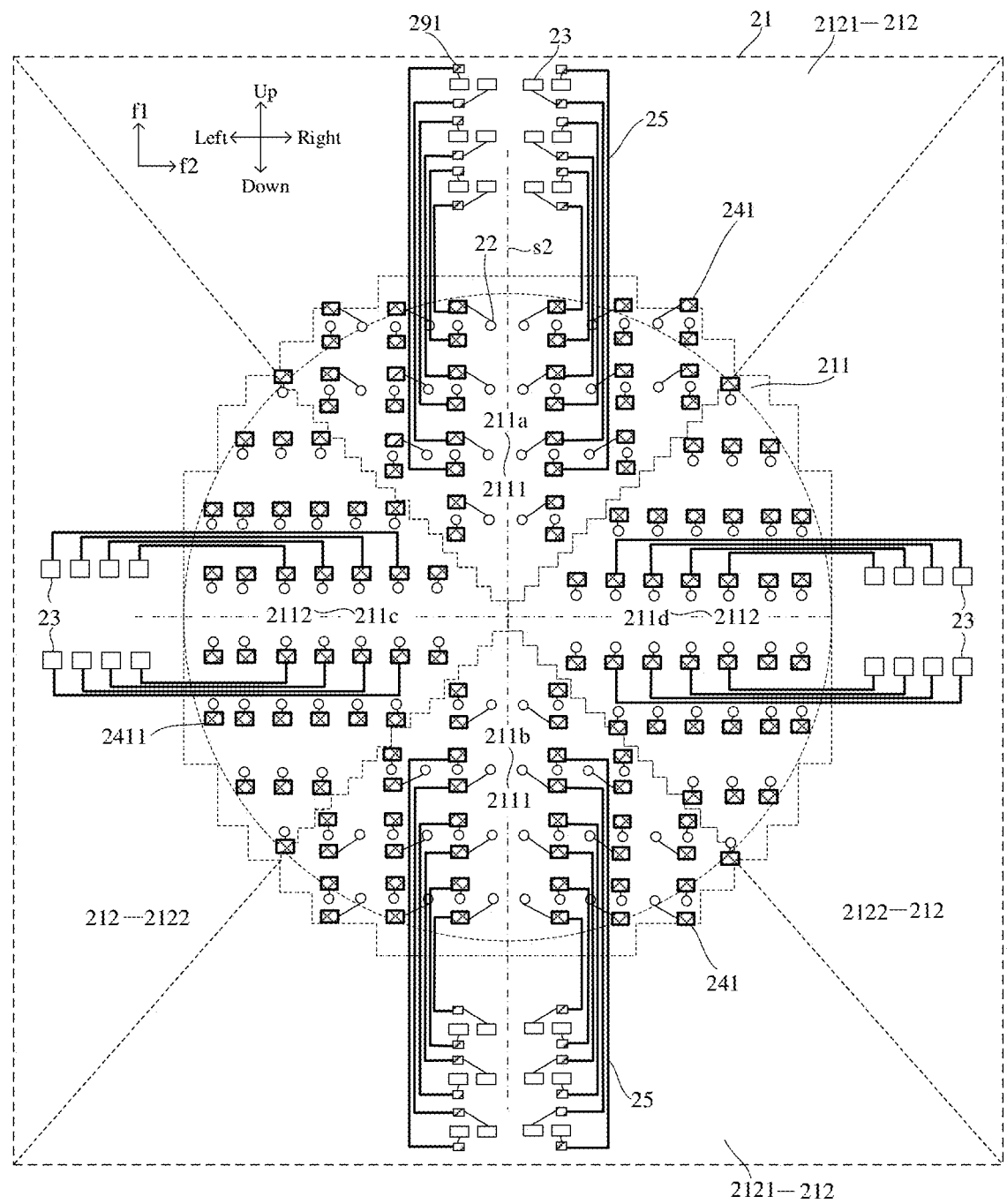
FIG. 11 is another schematic structural diagram of connection of the first light-emitting device and the first pixel drive circuit of the display panel illustrated in FIG. 9.

FIG. 11 is another schematic structural diagram of connection of a first light-emitting device and a first pixel drive circuit of the display panel illustrated in FIG. 9. Referring to FIG. 11, in an optional implementation, according to FIG. 3 in some practices, because the first light-emitting device 22 is disposed in the column direction f1 of the corresponding first via hole 241, the distance between two of the first via holes 241 adjacent in the row direction f2 is less than the distance between two of the first via holes 241 adjacent in the column direction f1. Exemplarily, in FIG. 3, a distance h1 between two via holes (a via hole 241a and a via hole 241c) that are disposed in either side in three via holes (the via hole 241a, a via hole 241b, and the via hole 241c) that are successively arranged in the row direction f2 is equal to a distance h2 between two via holes (the via hole a and a via hole d) adjacent in the column direction f1. Exemplarily, 4 connection lines 25 are arranged in a distance between two via holes (the via hole 241a and the via hole 241b, or the via hole 241b and the via hole 241c) adjacent in the row direction f2, and 13 connection lines 25 are arranged in the distance between two via holes (the via hole 241a and the via hole 241d) adjacent in the column direction f1, due to the fact that in arranging the connection line 25 between two via holes (the via hole 241a and the via hole 241b, or the via hole 241b and the via hole 241c) in the three via holes (the via hole 241a, the via hole 241b, and the via hole 241c) adjacent in the row direction f2, one of the via holes (the via hole 241b) occupies part of the substrate 21, such that the distance between two of the first via holes 241 adjacent in the row direction f2 is small.

In some embodiments of the present disclosure, the first light-emitting devices 22 disposed in two columns are respectively electrically connected to the first connection lines 251 of the connection lines 25 via the first via holes 241 disposed in a same column, such that the distance between two of the first via holes 241 adjacent in the row direction f2 is large. In this way, the number of first connection lines 251 between two of the first via holes 241 adjacent in the row direction f2 is increased, and thus the number of first light-emitting devices 22 in the light-transmissive display region 211 is increased.

As illustrated in FIG. 11, the first pixel drive circuit 23 electrically connected to the first light-emitting device 22 in the second light-transmissive display region 2112 is disposed in the row direction f2 of the first light-emitting device 22. A region between two of the first via holes 241 adjacent in the column direction f1 in the second light-transmissive display region 2112 is employed as a region for deploying the connection lines 25. In the case that the first light-emitting device 22 is disposed in the column direction f1 of the corresponding first via hole 241, a distance between two of the first via holes 241 adjacent in the column direction f1 in the second light-transmissive display region 2112 is large, and the first light-emitting devices 22 disposed in a same row in the second light-transmissive display region 2112 are respectively connected to the second connection lines 252 of the connection lines 25 via the first via holes 241 disposed in a same row, such that a difficulty in manufacturing the display panel 20 is reduced.

Optionally, in the first light-transmissive display region 2111, the plurality of first light-emitting devices 22 include at least two groups of first light-emitting devices 22 arranged along the column direction f1, and the connection lines 25 electrically connected to the at least two groups of first light-emitting devices 22 are disposed in different layers. In this way, wiring spaces of the connection lines 25 are increased, such that the connection lines 25 disposed in different layers are provided with their own wiring spaces, and thus more connection lines 25 are arranged in a limited space compared with a wiring method of single-layer wiring.

Optionally, in the second light-transmissive display region 2112, the plurality of first light-emitting devices 22 include at least two groups of first light-emitting devices 22 arranged along the row direction f2, and the connection lines 25 electrically connected to the at least two groups of first light-emitting devices 22 are disposed in different layers. In this way, wiring spaces of the connection lines 25 are increased, such that the connection lines 25 disposed in different layers are provided with their own wiring spaces, and thus more connection lines 25 are arranged in a limited space compared with a wiring method of single-layer wiring.

Figure 12:
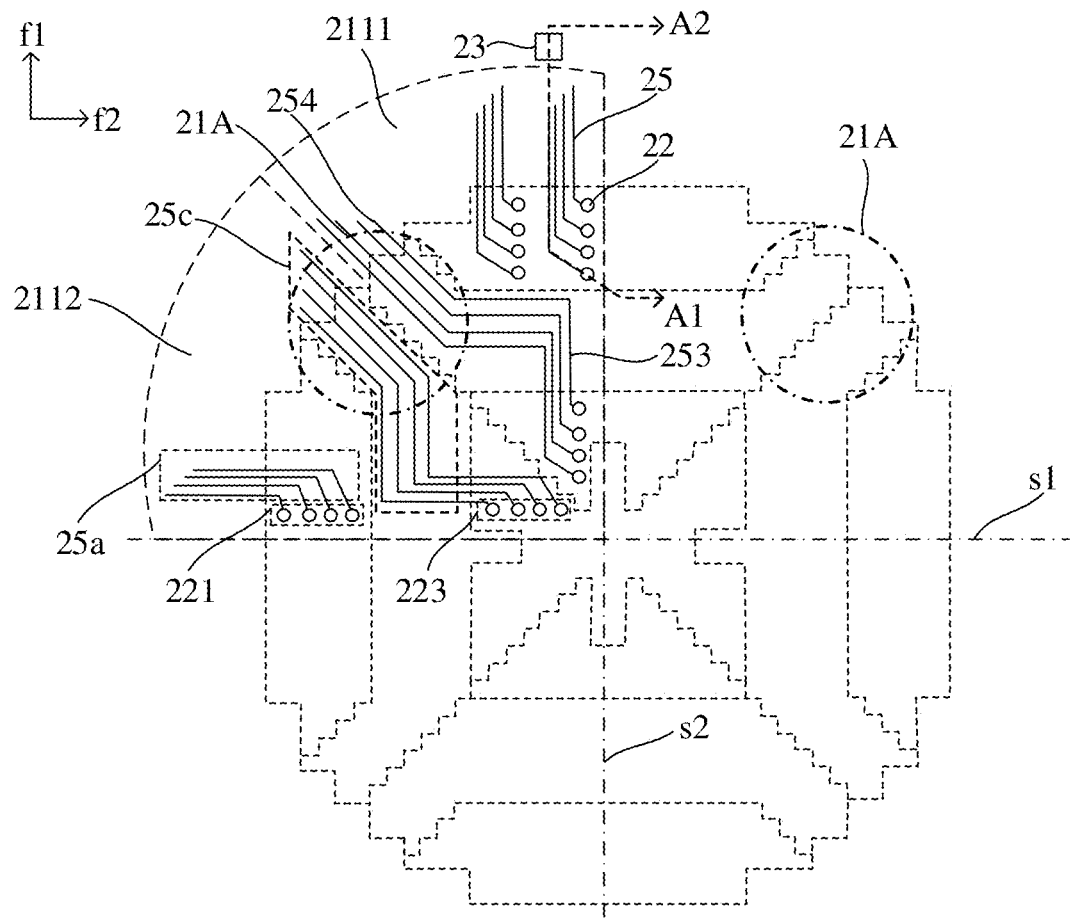
FIG. 12 is a schematic diagram of line-connection of a light-transmissive display region according to some embodiments of the present disclosure.
Figure 13:
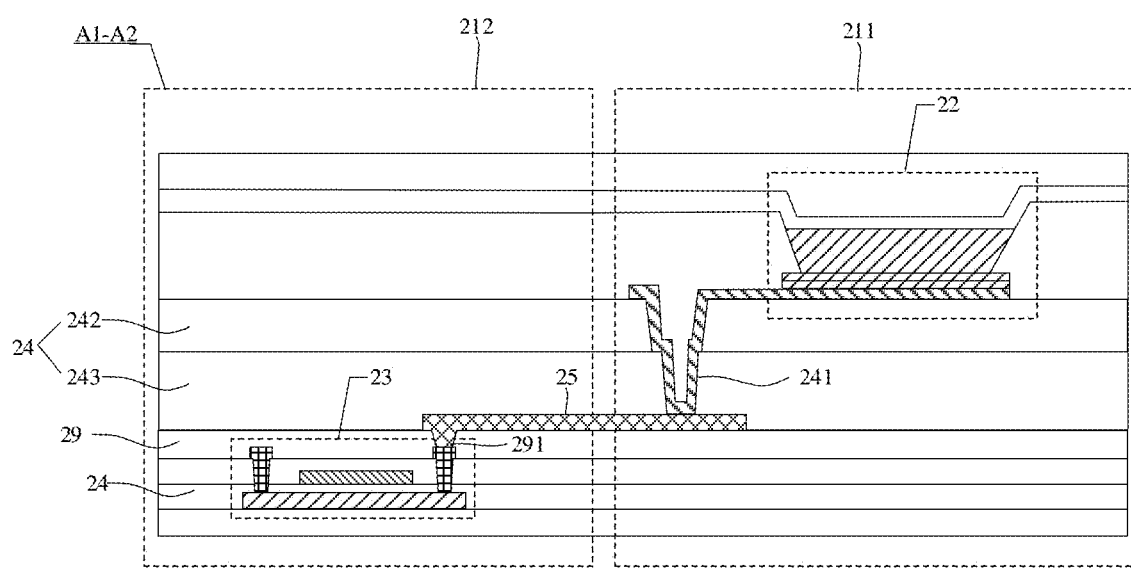
FIG. 13 is a schematic diagram of a sectional structure along positions A1-A2 in the line-connection schematic diagram illustrated in FIG. 12.
Figure 14:
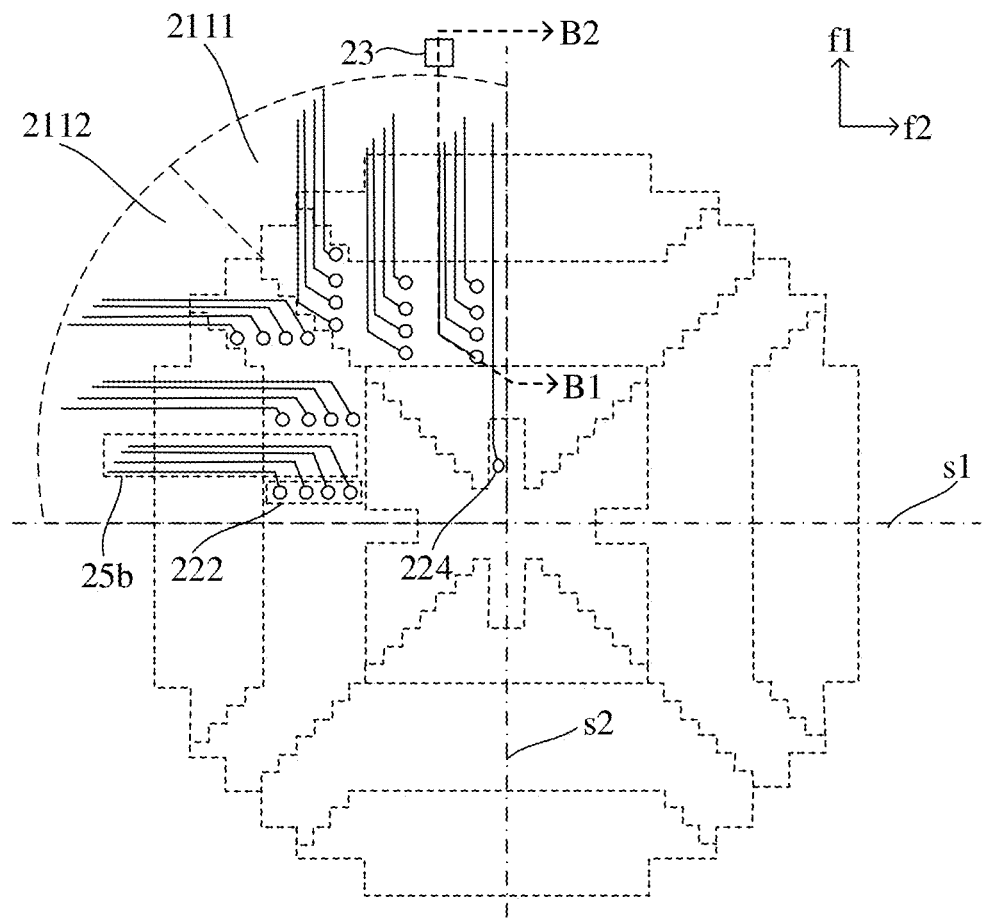
FIG. 14 is a schematic diagram of line-connection of a light-transmissive display region according to some embodiments of the present disclosure.
Figure 15:
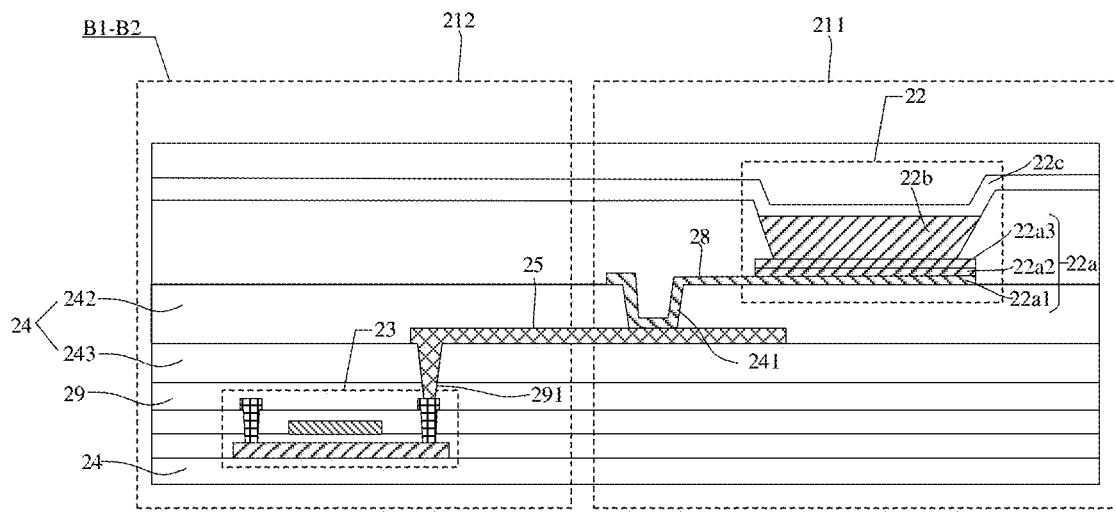
FIG. 15 is a schematic diagram of a sectional structure along positions B1-B2 in the line-connection schematic diagram illustrated in FIG. 14.

Exemplarily, FIG. 12 is a schematic diagram of line-connection of a light-transmissive display region according to some embodiments of the present disclosure, FIG. 13 is a schematic diagram of a sectional structure along positions A1-A2 in the line-connection schematic diagram illustrated in FIG. 12, FIG. 14 is a line-connection schematic diagram of a light-transmissive display region according to some embodiments of the present disclosure, and FIG. 15 is a schematic diagram of a sectional structure along positions B1-B2 in the line-connection schematic diagram illustrated in FIG. 14. Referring to FIG. 12, FIG. 13, FIG. 14, and FIG. 15, it should be noted that, in FIG. 12 and FIG. 14, for clearly illustrating connections of the plurality of first light-emitting devices 22, only connections of the connection lines 25 of a portion of regions in the first light-transmissive display region 2111 and the second light-transmissive display region 2112 are illustrated, and connections of other regions and the connections of light-transmissive zones illustrated are the same, and extension directions of the connection lines 25 disposed in different regions are symmetrical about an axis of symmetry (s1 or s2) of the light-transmissive display region 211

In FIG. 12 and FIG. 14, the first light-emitting devices connected to the connection lines in different layers are illustrated in two figures, FIG. 12 illustrates the plurality of light-emitting devices electrically connected to the plurality of connection lines disposed in a same structural layer, and FIG. 14 illustrates the plurality of light-emitting devices electrically connected to the plurality of connection lines disposed in another structural layer.

A row of first light-emitting devices 22 disposed in the second light-transmissive display region 1221 are divided into two groups of light-emitting device groups along the row direction f2: a first light-emitting device group 211 and a second light-emitting device group 222. The insulative layer 24 includes a first sub-insulative layer 241 and a second sub-insulative layer 242 that are successively stacked. The plurality of connection lines 25 include a first connection line group 25a and a second connection line group 25b.

The first connection line group 25a electrically connected to the first light-emitting device group 221 is disposed on a side, proximal to the substrate 21, of the first sub-insulative layer 243, and the second connection line group 25b electrically connected to the second light-emitting device group 222 are disposed on a side, proximal to the substrate 21, of the second sub-insulative layer 242.

Similarly, a row of first light-emitting devices 22 disposed in the second light-transmissive display region 1221 are divided into three, four, or more groups of light-emitting device groups along the row direction f2, and the connection lines electrically connected to each of the light-emitting device groups are disposed in different structural layers.

Optionally, in the plurality of connection lines 25 electrically connected to at least one group of light-emitting devices, at least one of the connection lines 25 includes a first sub-connection line 253 and a second sub-connection line 254. One end of the first sub-connection line 253 is electrically connected to the second sub-connection line 254, the other end is electrically connected to the first light-emitting device 22, and an included angle between an extension direction of the second sub-connection line 254 and the column direction f1 is an acute angle. That is, at least one group of first light-emitting devices 22 includes a plurality of first light-emitting devices 22, and in the plurality of first light-emitting devices 22, extension directions of the connection lines 25 electrically connected to a portion of the first light-emitting devices 22 are parallel to the row direction f2 or the column direction f1, and the connection lines 25 electrically connected to a portion of the first light-emitting devices 22 include two or more extension directions.

Exemplarily, referring to FIG. 12, a row of first light-emitting devices 22 disposed in the second light-transmissive display region 2112 further include a third group of light-emitting devices: a third light-emitting device group 233, and the plurality of connection lines 25 further include a third connection line group 25c. The first connection line group 25a and the third connection line group 25c that are respectively electrically connected to the first light-emitting device group 221 and the third light-emitting device group 223 are both disposed on the side, proximal to the substrate 21, of the first sub-insulative layer 21. That is, the connection lines 25 electrically connected to the first light-emitting device group 221 and the third light-emitting device group 223 are disposed in a same layer.

The first light-emitting device group 221 is disposed on a side, proximal to an edge of the light-transmissive display region 211, of the second light-emitting device group 222, and the first light-emitting device group 221 is disposed on a side, proximal to the edge of the light-transmissive display region 211, of the third light-emitting device group 223.

An arrangement direction of the plurality of light-emitting devices 22 in the first light-emitting device group 221 is parallel to the row direction 2. The second light-transmissive display region 2112 includes a plurality of first light-emitting device groups 221 along a direction away from the first axis of symmetry s1 of the light-transmissive display region 211, and thus in the direction away from the first axis of symmetry s1, the number of first light-emitting devices 22 in the first light-emitting device group 221 is reduced. The first axis of symmetry s1 is parallel to the row direction 2.

Exemplarily, the first light-emitting device group 221 proximal to the first axis of symmetry s1 includes 12 first light-emitting devices 22, and the first light-emitting device group 221 distal from the first axis of symmetry s2 includes 2 first light-emitting devices 22. As illustrated in FIG. 12, in a region, proximal to the edge of the light-transmissive display region 211, in the second light-transmissive display region 2112, the first light-emitting devices 22 in a portion of the region do not belong to the first light-emitting device group 221, and the portion of the region is referred to as a "gap region 21A." That is, the first light-emitting devices 22 in the first light-emitting device group 221 are not arranged in the "gap region 21A," and the connection lines 25 electrically connected to the first light-emitting devices 22 in the first light-emitting device group 221 are not arranged in the "gap region 21A."

The connection lines 25 electrically connected to the plurality of first light-emitting devices 22 in the third light-emitting device group 223 include the first sub-connection line 253 and the second sub-connection line 254. An extension direction of the first sub-connection line 253 is parallel to the row direction f2 or the column direction f1. An included angle with predefined degrees (e.g., 45 degrees) is provided between an extension direction of the second sub-connection line 254 and the row direction f2, such that the second sub-connection line 254 extends out of the light-transmissive display region 211 through the "gap region 21A."

In this way, the connection lines 25 electrically connected to the first light-emitting devices 22 that are in the first light-emitting device group 221 and the third light-emitting device group 223 are disposed in a same layer, and a cross short circuit is prevented from occurring between the connection lines 25 electrically connected to the first light-emitting device group 221 and the connection lines 25 (the first sub-connection line 253 and the second sub-connection line 254) electrically connected to the third light-emitting device group 223. In some practices, a distance between adjacent via holes 241 is small, and the number of connection lines 25 disposed in a same layer and connected to the light-emitting devices in the light-transmissive display region 211 is small, for example, 13 connection lines 25 are arranged in the distance between adjacent via holes 241, and the maximum number of connection lines 25 disposed in a same layer and connected to a row of light-emitting devices in some practices is 13. Compared with some practices, according to the connection method of the embodiments of the present disclosure, the number of light-emitting devices 25 that connected to the connection lines 25 and disposed in a same layer is large under the prerequisite that the distance between adjacent via holes 241 is limited. For example, 13 connection lines 25 are arranged in the distance between adjacent via holes 241, and the number of connection lines 25 disposed in a same layer and connected to a row of light-emitting devices in the embodiments of the present disclosure is a sum of the number of light-emitting devices in the first light-emitting device group 221 and the number of light-emitting devices in the third light-emitting device group 223. The number of light-emitting devices in the first light-emitting device group 221 is 12, and the number of light-emitting devices in the third light-emitting device group 223 ranges from 5 to 13, such that the number of connection lines 25 disposed in a same layer and connected to a row of first light-emitting devices ranges from 18 to 26.

The first light-emitting devices 22 in the second light-emitting device group 222 are connected to the connection lines 25 in another layer. In this way, the wiring spaces of the connection lines 25 are increased, such that the connection lines 25 disposed in different layers are provided with their own wiring spaces, and thus more connection lines 25 are arranged in a limited space compared with the wiring method of single-layer wiring.

Optionally, as illustrated in FIG. 9, the first light-transmissive display region 2111 includes a first light-transmissive zone 211a and a second light-transmissive zone 211b. The first light-transmissive zone 211a and the second light-transmissive zone 211b are arranged along the column direction f1. The second light-transmissive 211b includes a third light-transmissive zone 211c and a fourth light-transmissive zone 211d. The third light-transmissive zone 211c and the fourth light-transmissive zone 211d are arranged along the row direction f2. The first light-transmissive zone 211a, the second light-transmissive zone 211b, the third light-transmissive zone 211c, and the fourth light-transmissive zone 211d are arranged surrounding the center of the light-transmissive display region 211.

Optionally, the first light-transmissive zone 211a, the second light-transmissive zone 211b, the third light-transmissive zone 211c, and the fourth light-transmissive zone 211d are in a same shape. The first light-transmissive zone 211a, the second light-transmissive zone 211b, the third light-transmissive zone 211c, and the fourth light-transmissive zone 211d are respectively provided with a plurality of first light-emitting devices, and areas of the first light-transmissive zone 211a, the second light-transmissive zone 211b, the third light-transmissive zone 211c, and the fourth light-transmissive zone 211d are the same.

The first light-emitting devices 22 that are in the first light-transmissive zone 211a, the second light-transmissive zone 211b, the third light-transmissive zone 211c, and the fourth light-transmissive zone 211d extend, by the connection lines 25 electrically connected to the first via holes 241, from the center of the light-transmissive display region 211 to the edge of the light-transmissive display region 211.

In this way, the numbers of light-emitting devices in the above four light-transmissive zones are substantially the same, differences between lengths of the connection lines 25 corresponding to the light-emitting devices in the plurality of light-transmissive zones are small, and brightness of the light-emitting devices in the four light-transmissive zones of the light-transmissive display region 211 is uniform, such that that display effect of the light-transmissive display region 211 is improved.

Exemplarily, the first light-transmissive zone 211a, the second light-transmissive zone 211b, the third light-transmissive zone 211c, and the fourth light-transmissive zone 211d are triangular-shaped or fan-shaped. In the case that the light-transmissive display region 211 is rectangular-shaped, the first light-transmissive zone 211a, the second light-transmissive zone 211b, the third light-transmissive zone 211c, and the fourth light-transmissive zone 211d are triangular-shaped. In the case that the light-transmissive display region 211 is circular-shaped, the first light-transmissive zone 211a, the second light-transmissive zone 211b, the third light-transmissive zone 211c, and the fourth light-transmissive zone 211d are fan-shaped. The center of the light-transmissive display region 211 is an intersection of two diagonals or a circle center of the light-transmissive display region 211.

The plurality of first pixel drive circuits 23 connected to the plurality of first light-emitting devices 22 in the light-transmissive display region 211 are arranged surrounding the light-transmissive display region 211. Referring to FIG. 10, the first pixel drive circuits 23 disposed in the conventional display region 212 are disposed on the periphery of the light-transmissive display region 211. In this way, the plurality of first light-emitting devices 22 in at least one row of first light-emitting devices 22 disposed within the light-transmissive display region 211 are respectively electrically connected to the first pixel drive circuits 23 disposed on an upper side, a bottom side, a left side, and a right side of the light-transmissive display region 211, such that, compared with some practices where the first light-emitting devices 22 are only electrically connected to the first pixel drive circuits 23 disposed on two sides of the light-transmissive display region 211, a portion of the first light-emitting devices 22 are connected to the closer first pixel drive circuits 23, and thus the lengths of a portion of the connection lines 25 for connecting the first light-emitting devices 22 to the first pixel drive circuits 23 are small. Therefore, a parasitic capacitance on the connection line 25 is reduced, such that a response rate of the light-transmissive display region 211 when displaying pictures with low gray scales is improved, and thus the display effect of the light-transmissive display region 211 is improved.

Optionally, arrangement positions of the plurality of via holes 241 disposed in the first light-transmissive zones 211a and arrangement positions of the plurality of via holes 241 disposed in the second light-transmissive zones 211b are symmetrical about the first axis of symmetry s1 of the light-transmissive display region 211, and the first axis of symmetry s1 is parallel to the row direction 2. Arrangement positions of the plurality of via holes 241 disposed in the third light-transmissive zones 211c and arrangement positions of the plurality of via holes 241 disposed in the fourth light-transmissive zones 211c are symmetrical about the second axis of symmetry s2 of the light-transmissive display region 211, and the second axis of symmetry s2 is parallel to the column direction f1.

The above arrangement positions of the via holes 241 in the plurality of light-transmissive zones have the following two effects: in one aspect, a difference between the lengths of the connection lines 25 electrically connected to the first light-emitting devices 22 in the first light-transmissive zone 211a and the second light-transmissive zone 211b is small, such that the brightness of the first light-emitting devices 22 in the first light-transmissive zone 211a and the second light-transmissive zone 211b of the light-transmissive display region 211 is uniform, and thus the display effect of the light-transmissive display region 211 is improved; in another aspect, a difference between the lengths of the connection lines 25 electrically connected to the first light-emitting devices 22 in the third light-transmissive zone 211c and the fourth light-transmissive zone 211d is small, such that the brightness of the first light-emitting devices 22 in the third light-transmissive zone 211c and the fourth light-transmissive zone 211d of the light-transmissive display region 211 is uniform, and thus the display effect of the light-transmissive display region 211 is improved. A plurality of axes of symmetry of the plurality of light-transmissive zones are parallel or perpendicular to each other, such that the layout of the connection lines 25 in the light-transmissive display region 211 is regular.

Optionally, as illustrated in FIG. 9, at least one target light-transmissive zone of the first light-transmissive zone 211a, the second light-transmissive zone 211b, the third light-transmissive zone 211c, and the fourth light-transmissive zone 211d includes a first sub-zone 211x and a second sub-zone 211y. The center of the light-transmissive display region 211 is disposed on an axis of symmetry of the target light-transmissive zone.

In the target light-transmissive zone, the arrangement position of the first via hole 241 in the first sub-zone 211x and the arrangement position of the first via hole 241 in the second sub-zone 211y are symmetrical about the axis of symmetry of the target light-transmissive zone. The axis of symmetry of the target light-transmissive zone is coincident with the first axis of symmetry s1 or the second axis of symmetry s2 of the light-transmissive display region 211. Exemplarily, each of the first light-transmissive zone 211a, the second light-transmissive zone 211b, the third light-transmissive zone 211c, and the fourth light-transmissive zone 211d includes the first sub-zone 211x and the second sub-zone 211y that are arranged symmetrically, and the extension direction of the connection line 25 electrically connected to the first light-emitting devices 22 disposed in the first sub-zone 211x and the extension direction of the connection line 25 electrically connected to the first light-emitting devices 22 disposed in the second sub-zone 211y are symmetrical about the first axis of symmetry s1 or the second axis of symmetry s2.

Optionally, in the target light-transmissive zone, the connection line 25 electrically connected to the first light-emitting device 22 in the first sub-zone 211x and the connection line 25 electrically connected to the first light-emitting device 22 in the second sub-zone 211y are symmetrical about the axis of symmetry of the target light-transmissive zone in terms of shape. In this way, areas of the first sub-zone 211x and the second sub-zone 211y in each of the light-transmissive zones are the same, such that the numbers of first light-emitting devices 22 in the first sub-zone 211x and the second sub-zone 211y are substantially the same, and thus differences of the lengths of the connection lines 25 electrically connected to the first light-emitting devices 22 in the first sub-zone 211x and the second sub-zone 211y are small. Therefore, the brightness of the first light-emitting devices 22 in the first sub-zone 211x and the second sub-zone 211y of the light-transmissive display region 211 is uniform, such that the display effect of the light-transmissive display region 211 is improved.

In an optional implementation, as illustrated in FIG. 9 and FIG. 14, the via holes 241 in the first sub-zone 211x and the second sub-zone 211y in each of the light-transmissive zones are arranged symmetrically, and thus a large space is available near the axis of symmetry of the light-transmissive display region 211; and the number of light-emitting devices in a region near the axis of symmetry of the light-transmissive display region 211 is large, and thus more connection lines 25 are arranged in the region near the axis of symmetry, such that the light-emitting devices near the axis of symmetry of the light-transmissive display region 211 are electrically connected to the corresponding connection lines 25. The connection lines 25 electrically connected to the light-emitting devices in the first light-transmissive zone 211a are arranged in a same way as the connection lines 25 electrically connected to the light-emitting devices in the third light-transmissive zone 211c. The first light-transmissive zone 211a further includes a fourth light-emitting device group 224, and the connection lines 25 electrically connected to the light-emitting devices in the fourth light-emitting device group 224 and the connection lines 25 electrically connected to the second light-emitting device group 222 are disposed in a same layer. It should be noted that the above axes of symmetry include the first axis of symmetry s1 and the second axis of symmetry s2 of the light-transmissive display region 211.

Optionally, referring to FIG. 7 and FIG. 8, the display panel 20 further includes a second insulative layer 29. The second insulative layer 29 is disposed on a side, proximal to the substrate 21, of the connection line 25 and is provided with second via holes 291 arranged in rows and columns. The first pixel drive circuits 23 are arranged in arrays in the conventional display region 212. In the conventional display region 212, the first pixel drive circuits disposed in different columns are respectively electrically connected to the first connection lines 251 of the connection lines 25 via the second via holes 291 disposed in a same column. In this wat, a distance between two of the second via holes 291 adjacent in the row direction f2 is increased, such that the number of connection lines 25 between adjacent two of the second via holes 291 is increased.

Therefore, the first light-emitting devices 22 in the first light-transmissive display region 2111 correspond to rows or columns of the electrically connected first pixel drive circuits 23 in the first conventional display region 2121. Exemplarily, the light-transmissive display region 211 illustrated in FIG. 7 includes two first light-emitting devices 22D disposed in a row, and two first pixel drive circuits 23D correspondingly electrically connected to the two first light-emitting devices 22D are disposed in a row. In this way, the first pixel drive circuits 23 correspondingly electrically connected to the plurality of first light-emitting devices 22 disposed in a same row are in a same row, and the first pixel drive circuits 23 correspondingly electrically connected to the plurality of first light-emitting devices 22 disposed in a same column are in a same column.

The display panel 20 further includes a plurality of gate drive circuit units. The plurality of gate drive circuit units drive a plurality of rows of first pixel drive circuits 23 on the display panel 20 row-wise to drive a plurality of rows of first light-emitting devices 22. That is, one of the gate drive circuit units drives a row of first pixel drive circuits 23. In display panel 20 of the embodiments of the present disclosure, the distance between two of the via holes adjacent in the row direction f2 in the light-transmissive display region 211 and the conventional display region 212 is large, and a row of first light-emitting devices 22 corresponds to a row of first pixel drive circuits 23. In this way, a row of first light-emitting devices 22 is prevented from corresponding to the plurality of rows of first pixel drive circuits 23, such that the plurality of gate drive circuit units are prevented from driving a row of first light-emitting devices 22, and thus a difficulty in driving the first light-emitting devices 22 row-wise by the gate drive circuit unit is reduced.

Optionally, as illustrated in FIG. 10, in the second conventional display region 2122, the first pixel drive circuits 23 disposed in different rows are respectively electrically connected to the second connection lines 252 of the connection lines 25 via the second via holes 291 disposed in a same row. In this way, the distance between two of the second via holes 291 adjacent in the column direction f1 is increased, such that the number of connection lines 25 between two of the second via holes 291 in increased.

Therefore, the first light-emitting devices 22 in the second light-transmissive display region 2112 correspond to rows or columns of the electrically connected first pixel drive circuits 23 in the second conventional display region 2122.

Optionally, as illustrated in FIG. 6, the display panel 20 further includes: a plurality of second pixel drive circuits 27 and a plurality of second light-emitting devices 26 that are disposed in the conventional display region 212. The plurality of second pixel drive circuits 27 and the plurality of second light-emitting devices 26 that are disposed in the conventional display region 212 are electrically connected to each other. The second pixel drive circuit 27 is configured to drive the second light-emitting device 26 to emit light. An arrangement density of the plurality of second light-emitting devices 26 disposed in the conventional display region 212 and an arrangement density of the plurality of first light-emitting devices 22 disposed in the light-transmissive display region 211 are the same, such that the display effect of the conventional display region is close to that of the light-transmissive display region 211.

Figure 16:
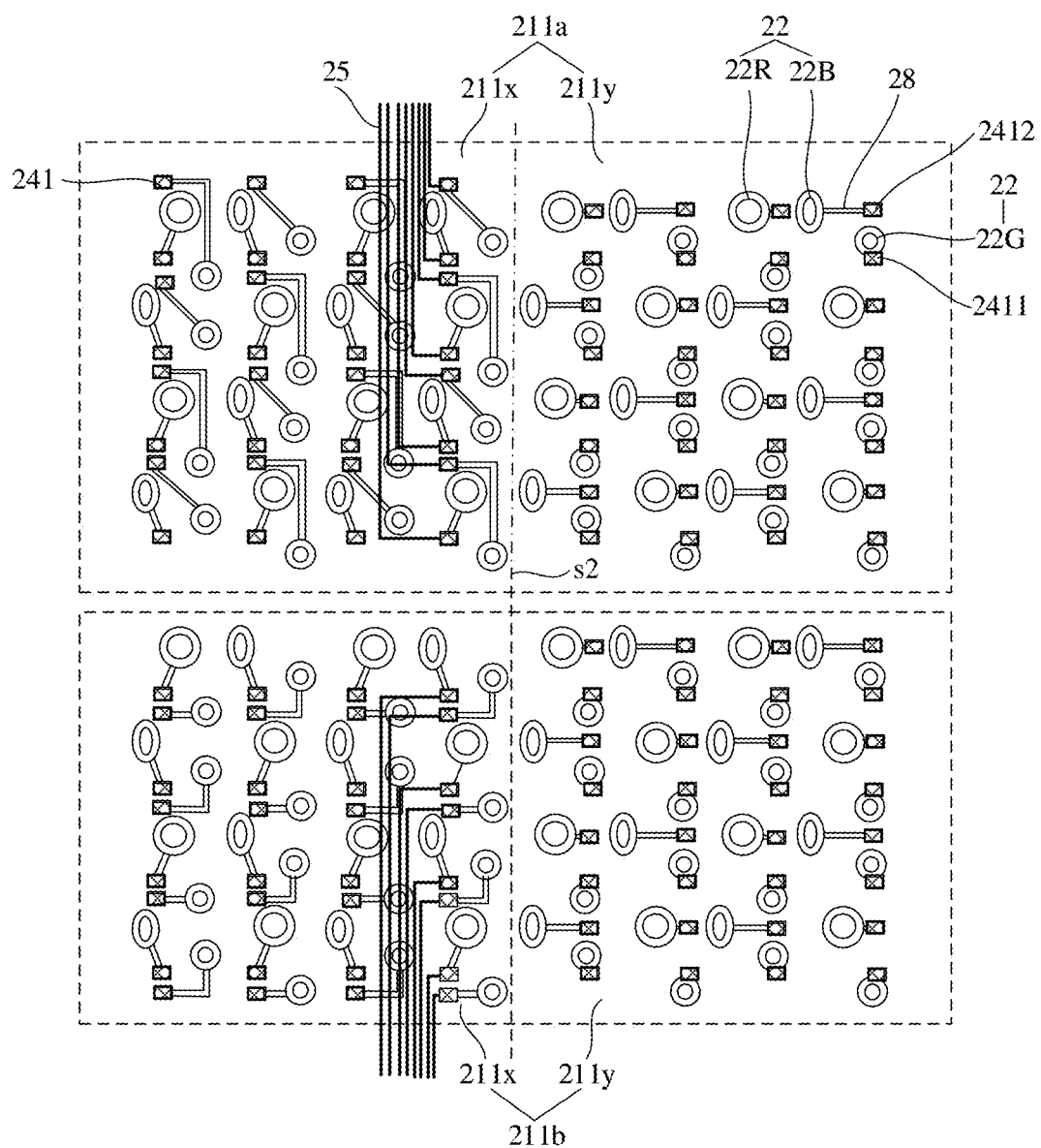
FIG. 16 is a schematic diagram of a partial structure of a light-transmissive display region according to some embodiments of the present disclosure.

Optionally, FIG. 16 is a schematic diagram of a partial structure of a light-transmissive display region according to some embodiments of the present disclosure. As illustrated in FIG. 16, FIG. 16 illustrates schematic diagrams of partial structures of the first light-transmissive zone 211a and the second light-transmissive zone 211b in the first light-transmissive display region 2111. The plurality of first light-emitting devices include a first color light-emitting device, a second color light-emitting device, and a third color light-emitting device. An area of an orthographic projection of an anode of the first light-emitting device in the light-transmissive display region 211 on the substrate 21 is less than an area of an orthographic projection of an anode of the second light-emitting device in the conventional display region on the substrate 21, such that a space between adjacent two of the first light-emitting devices 22 is large, and thus adjacent two of the via holes 241 are disposed between the space between adjacent two of the first light-emitting devices 22.

Exemplarily, the first color light-emitting device is a green light-emitting device 22G for emitting green light, the second color light-emitting device is a red light-emitting device 22R for emitting red light, and the third color light-emitting device is a blue light-emitting device 22B for emitting blue light. A row of light-emitting devices in the light-transmissive display region 211 includes a plurality of light-emitting device groups. The plurality of light-emitting devices in one group of the plurality of light-emitting device groups are arranged along the row direction f2 in an order of: the red light-emitting device 22R, the green light-emitting device 22B, the blue light-emitting device 22B, and the green light-emitting device 22G, and two light-emitting devices adjacent to the second axis of symmetry s2 are the green light-emitting device 22G and the red light-emitting device 22R.

The first via hole 241 corresponding to the green light-emitting device 22R in the first sub-zone 211x of the first light-transmissive zone 211a is disposed on a side, distal from the second axis of symmetry s2, of the green light-emitting device 22G. The first via hole 241 corresponding to the red light-emitting device 22R in the second sub-zone 211y of the first light-transmissive zone 211a is disposed on a side, distal from the second axis of symmetry s2, of the red light-emitting device 22R, and the first via hole 241 corresponding to the blue light-emitting device 22B is disposed on the side, distal from the second axis of symmetry s2, of the red light-emitting device 22R.

Optionally, referring to FIG. 15 and FIG. 16, the display panel further includes a transparent conductive connection line 28 disposed on the first insulative layer 24. One end of the transparent conductive connection line 28 is electrically connected to the first light-emitting device 22, and the other end is electrically connected to the connection line 25 via the first via hole 241. The transparent conductive connection line 28 is made of indium tin oxide (ITO). The first light-emitting device 22 is an organic light-emitting diode (OLED) light-emitting device. The first light-emitting device 22 at least includes: an anode 22a, a light-emitting layer 22b, and a cathode 22c that are stacked along a direction away from the substrate 21. The anode 22a of the first light-emitting device 22 includes a first transparent conductive layer 22a1, a reflective layer 22a2, and a second transparent conductive layer 22a3 that are stacked along the direction away from the substrate 21, the first transparent conductive layer 22a1 and the second transparent conductive layer 22a3 are made of ITO, and the reflective layer 22a2 is made of silver.

The anode 22a in the first light-emitting device 22 is electrically connected to the via hole 241 by the transparent conductive connection line 28, such that the light transmission of the light-transmissive display region 211 is further improved.

In summary, the embodiments of the present disclosure provide a display panel. The first light-emitting device is electrically connected to the first pixel drive circuit via the first via hole and the connection line, and the first light-emitting devices disposed in different columns are electrically connected to the first connection lines via the first via holes disposed in the same column. In this way, the distance between two of the first via holes adjacent in the row direction is increased, such that more first connection lines are capable of being arranged between the two of the first via holes, and thus the number of first light-emitting devices in the light-transmissive display region is increased. Therefore, the problem of the poor display effect of the light-transmissive display region of the display panel in some practices is addressed, and the display effect of the light-transmissive display region is improved.

Some embodiments of the present disclosure further provide a display device. The display device includes: a photo-sensitive sensor and the display panel as described above. The photo-sensitive sensor is disposed on a side, distal from a light-emitting device of the display panel, of a substrate of the display panel. An orthographic projection of an in-light surface of the photo-sensitive sensor on the substrate of the display panel is within a light-transmissive display region.

The display device is a smart phone, a table computer, a television, a display, a notebook computer, a digital photo frame, a navigator, and any other product with a display function. The photo-sensitive sensor is an image sensor, a light sensor, or a distance sensor that is in a camera, wherein the image sensor is employed for face recognition or fingerprint recognition.

It should be pointed out that in the accompanying drawings, sizes of layers and regions may be exaggerated for clearer illustration. It should be understood that in the case that an element or layer is referred to as being "on" another element or layer, the element or layer may be directly on another element, or intervening layers therebetween may be present. In addition, it should be understood that in the case that an element or layer is referred to as being "under" another element or layer, the element or layer may be directly under the other element, or there may be more than one intervening layer or element. In addition, it may be further understood that in the case that a layer or element is referred to as being "between" two layers or two elements, the layer may be the only layer between the two layers or two elements, or more than one intervening layer or element may further be present. Similar reference numerals indicate similar elements throughout.

In the present disclosure, the terms "first," "second," "third," "fourth," "fifth," and "sixth" are only used for descriptive purposes, and cannot be understood as indicating or implying relative importance. The term "a plurality of" refers to two or more, unless expressly defined otherwise.

Described above are merely exemplary embodiments of the present disclosure, and are not intended to limit the present disclosure. Therefore, any modifications, equivalent substitutions, improvements, and the like made within the spirit and principles of the present disclosure shall be included in the protection scope of the present disclosure.

What is claimed is:

1. A display panel, comprising:
a substrate, comprising a light-transmissive display region and a conventional display region at least partially surrounding the light-transmissive display region;
a connection line and a first pixel drive circuit, wherein the connection line and the first pixel drive circuit are disposed on the substrate, the connection line is electrically connected to the first pixel drive circuit, and the first pixel drive circuit is disposed in the conventional display region;
a first insulative layer, wherein the first insulative layer is disposed on a side, distal from the substrate, of the connection line and is provided with first via holes arranged in arrays; and
first light-emitting devices, disposed on a side, distal from the substrate, of the first insulative layer, wherein the first light-emitting devices are arranged in arrays in the light-transmissive display region and electrically connected to the connection lines via the first via holes;
wherein the light-transmissive display region comprises a first light-transmissive display region, and the conventional display region comprises a first conventional display region adjacent to the first light-transmissive display region in a column direction, wherein in the first light-transmissive display region, the first light-emitting devices disposed in different columns are respectively electrically connected to first connection lines of the connection lines via the first via holes disposed in a same column, the first connection line being electrically connected to the first pixel drive circuit in the first conventional display region; and
wherein the light-transmissive display region further comprises a second light-transmissive display region, and the conventional display region further comprises a second conventional display region adjacent to the second light-transmissive display region in a row direction, wherein the first light-emitting devices disposed in different rows are electrically connected to second connection lines of the connection lines via the first via holes disposed in a same row, the second connection line being electrically connected to the first pixel drive circuit in the second conventional display region.

2. The display panel according to claim 1, wherein in the first light-transmissive display region, the first light-emitting devices comprise at least two groups of the first light-emitting devices arranged along the column direction, the connection lines electrically connected to the at least two groups of the first light-emitting devices being disposed in different layers.

3. The display panel according to claim 1, wherein in the second light-transmissive display region, the first light-emitting devices comprise at least two groups of the first light-emitting devices arranged along the row direction, the connection lines electrically connected to the at least two groups of the first light-emitting devices being disposed in different layers.

4. The display panel according to claim 2, wherein in a plurality of the connection lines electrically connected to the at least one group of the first light-emitting devices, at least one of the connection lines comprises a first sub-connection line and a second sub-connection line, wherein one end of the first sub-connection line is electrically connected to the second sub-connection line, and the other end is electrically connected to the first light-emitting device, an included angle between an extension direction of the second sub-connection line and the column direction being an acute angle.

5. The display panel according to claim 1, wherein
the first light-transmissive display region comprises a first light-transmissive zone and a second light-transmissive zone that are arranged along the column direction; and
the second light-transmissive display region comprises a third light-transmissive zone and a fourth light-transmissive zone that are arranged along the row direction.

6. The display panel according to claim 5, wherein the first light-transmissive zone, the second light-transmissive zone, the third light-transmissive zone, and the fourth light-transmissive zone are in a same shape.

7. The display panel according to claim 5, wherein
arrangement positions of a plurality of the first via holes disposed in the first light-transmissive zone and arrangement positions of a plurality of the first via holes disposed in the second light-transmissive zone are symmetrical about a first axis of symmetry of the light-transmissive display region, the first axis of symmetry being parallel to the row direction; and
arrangement positions of a plurality of the first via holes disposed in the third light-transmissive zone and arrangement positions of a plurality of the first via holes disposed in the fourth light-transmissive zone are symmetrical about a second axis of symmetry of the light-transmissive display region, the second axis of symmetry being parallel to the column direction.

8. The display panel according to claim 5, wherein at least one target light-transmissive zone of the first light-transmissive zone, the second light-transmissive zone, the third light-transmissive zone, and the fourth light-transmissive zone comprises a first sub-zone and a second sub-zone that are symmetrically arranged, and a center of the light-transmissive display region is disposed on an axis of symmetry of the target light-transmissive zone;
wherein in the target light-transmissive zone, an arrangement position of the first via hole in the first sub-zone and an arrangement position of the first via hole in the second sub-zone are symmetrical about the axis of symmetry of the target light-transmissive zone.

9. The display panel according to claim 8, wherein in the target light-transmissive zone, the connection line electrically connected to the first light-emitting device in the first sub-zone and the connection line electrically connected to the first light-emitting device in the second sub-zone are symmetrical about the axis of symmetry of the target light-transmissive zone in terms of shape.

10. The display panel according to claim 1, further comprising: a second insulative layer, wherein the second insulative layer is disposed on a side, proximal to the substrate, of the connection line and is provided with second via holes arranged in arrays;
wherein the first pixel drive circuits are arranged in arrays in the conventional display region, and in the first conventional display region, the first pixel drive circuits disposed in different columns are respectively electrically connected to the first connection lines of the connection lines via the second via holes disposed in a same column.

11. The display panel according to claim 1, further comprising: a second insulative layer, wherein the second insulative layer is disposed on a side, proximal to the substrate, of the connection line and is provided with second via holes arranged in arrays;
wherein the first pixel drive circuits are arranged in arrays in the conventional display region, and in the second conventional display region, the first pixel drive circuits disposed in different rows are respectively electrically connected to the second connection lines of the connection lines via the second via holes disposed in a same row.

12. The display panel according to claim 1, further comprising: a plurality of second pixel drive circuits and a plurality of second light-emitting devices that are disposed in the conventional display region, and the plurality of second pixel drive circuits and the plurality of second light-emitting devices that are disposed in the conventional display region are respectively electrically connected to each other;
wherein an arrangement density of the plurality of second light-emitting devices disposed in the conventional display region and an arrangement density of the plurality of first light-emitting devices disposed in the light-transmissive display region are identical.

13. The display panel according to claim 1, further comprising: a transparent conductive connection line disposed on the first insulative layer, wherein one end of the transparent conductive connection line is electrically connected to the first light-emitting device, and the other end is electrically connected to the connection line via the first via hole.

14. A display device, comprising: a photo-sensitive sensor and a display panel; wherein the display panel comprises:
a substrate, comprising a light-transmissive display region and a conventional display region at least partially surrounding the light-transmissive display region;
a connection line and a first pixel drive circuit, wherein the connection line and the first pixel drive circuit are disposed on the substrate, the connection line is electrically connected to the first pixel drive circuit, and the first pixel drive circuit is disposed in the conventional display region;
a first insulative layer, wherein the first insulative layer is disposed on a side, distal from the substrate, of the connection line and is provided with first via holes arranged in arrays; and
first light-emitting devices, disposed on a side, distal from the substrate, of the first insulative layer, wherein the first light-emitting devices are arranged in arrays in the light-transmissive display region and electrically connected to the connection lines via the first via holes;
wherein the light-transmissive display region comprises a first light-transmissive display region, and the conventional display region comprises a first conventional display region adjacent to the first light-transmissive display region in a column direction, wherein in the first light-transmissive display region, the first light-emitting devices disposed in different columns are respectively electrically connected to first connection lines of the connection lines via the first via holes disposed in a same column, the first connection line being electrically connected to the first pixel drive circuit in the first conventional display region;
and the photo-sensitive sensor is disposed on a side, distal from the light-emitting device of the display panel, of the substrate of the display panel, and an orthographic projection of an in-light surface of the photo-sensitive sensor on the substrate of the display panel is within the light-transmissive display region; and
wherein the light-transmissive display region further comprises a second light-transmissive display region, and the conventional display region further comprises a second conventional display region adjacent to the second light-transmissive display region in a row direction, wherein the first light-emitting devices disposed in different rows are electrically connected to second connection lines of the connection lines via the first via holes disposed in a same row, the second connection line being electrically connected to the first pixel drive circuit in the second conventional display region.

15. The display device according to claim 14, wherein in the first light-transmissive display region, the first light-emitting devices comprise at least two groups of the first light-emitting devices arranged along the column direction, the connection lines electrically connected to the at least two groups of the first light-emitting devices being disposed in different layers.

16. The display device according to claim 14, wherein in the second light-transmissive display region, the first light-emitting devices comprise at least two groups of the first light-emitting devices arranged along the row direction, the connection lines electrically connected to the at least two groups of the first light-emitting devices being disposed in different layers.

17. The display device according to claim 15, wherein in a plurality of the connection lines electrically connected to the at least one group of the first light-emitting devices, at least one of the connection lines comprises a first sub-connection line and a second sub-connection line, wherein one end of the first sub-connection line is electrically connected to the second sub-connection line, and the other end is electrically connected to the first light-emitting device, an included angle between an extension direction of the second sub-connection line and the column direction being an acute angle.

18. The display device according to claim 14, wherein the first light-transmissive display region comprises a first light-transmissive zone and a second light-transmissive zone that are arranged along the column direction; and
the second light-transmissive display region comprises a third light-transmissive zone and a fourth light-transmissive zone that are arranged along the row direction.

* * * * *